US012622205B2

(12) United States Patent (10) Patent No.: US 12,622,205 B2
Lee et al. (45) Date of Patent: May 5, 2026

(54) DISPLAY DEVICE AND METHOD OF MANUFACTURING THE SAME

(71) Applicant: Samsung Display Co., LTD., Yongin-si (KR)

(72) Inventors: Joon Gu Lee, Yongin-si (KR); Hye Jin Gwark, Yongin-si (KR); Jae Ik Kim, Yongin-si (KR); Hwi Kim, Yongin-si (KR); Jung Sun Park, Yongin-si (KR); Yeon Hwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/337,864

(22) Filed: Jun. 20, 2023

(65) Prior Publication Data

US 2024/0107857 A1 Mar. 28, 2024

(30) Foreign Application Priority Data

Sep. 28, 2022 (KR) ......................... 10-2022-0122939

(51) Int. Cl.
*H01L 29/08* (2006.01)
*H01L 21/02* (2006.01)
*H01L 21/67* (2006.01)
(52) U.S. Cl.
CPC .... *H01L 21/6708* (2013.01); *H01L 21/02274* (2013.01); *H01L 21/6719* (2013.01)
(58) Field of Classification Search
CPC ........... H01L 21/6708; H01L 21/02274; H01L 21/6719

USPC .......................................................... 257/40
See application file for complete search history.

(56) References Cited

U.S. PATENT DOCUMENTS

| | | |
|---|---|---|
| 2016/0013438 A1 | 1/2016 | Im et al. |
| 2021/0159289 A1 | 5/2021 | Liu |
| 2021/0202655 A1 | 7/2021 | Cho et al. |

FOREIGN PATENT DOCUMENTS

| | | | | |
|---|---|---|---|---|
| CN | 106206650 A | * 12/2016 | ........... | H10K 59/873 |
| CN | 113782692 A | * 12/2021 | ......... | H10K 59/1201 |
| KR | 10-2016-0006110 | 1/2016 | | |
| KR | 10-2019-0079265 | 7/2019 | | |
| KR | 10-2019-0079954 | 7/2019 | | |
| KR | 10-2021-0086869 | 7/2021 | | |

* cited by examiner

*Primary Examiner* — Phuc T Dang
(74) *Attorney, Agent, or Firm* — Sughrue Mion, PLLC

(57) ABSTRACT

A display device includes a thin-film transistor, a source/drain electrode and an auxiliary electrode including a first conductive layer and a second conductive layer disposed on the first conductive layer, a via insulating layer having a first opening exposing the auxiliary electrode, a capping layer covering a portion of the auxiliary electrode and a light emitting material layer and a common electrode layer sequentially stacked on the via insulating layer and the capping layer, wherein the source/drain electrode is electrically connected to the thin-film transistor through a contact hole penetrating the interlayer insulating layer, the auxiliary electrode has an undercut, and the capping layer includes a first capping layer covering side surfaces of the first conductive layer of the auxiliary electrode and a second capping layer separated from the first capping layer and disposed on the second conductive layer of the auxiliary electrode.

17 Claims, 16 Drawing Sheets

DSL : DE, SE, AUE
CCE : CCE1, CCE2
PXL : PXE, PXDE1, PXDE2
EML : EL, EDL
CEL : CE, CDE
ED : PXE, CE, EL

CCE : CCE1, CCE2
CCE1 : CCE1a, CCE1b
CEL : CE, CDE
AUE : AUEa, AUEb, AUEc

CCE' : CCE1', CCE2

CCE : CCE1, CCE2

CCE_1 : CCE1_1, CCE2
CCE1_1 : CCE1a, CCE1b_1
CEL : CE, CDE
AUE : AUEa, AUEb, AUEc

CCE_2 : CCE1_2, CCE2
CCE1_2 : CCE1a, CCE1b_2
CCE1b_2 : CCE1b_2a, CCE1b_2b
CEL : CE, CDE
AUE : AUEa, AUEb, AUEc

DSL : DE, SE, AUE
CCE : CCE1, CCE2
PXL : PXE, PXDE1, PXDE2
EML : EL, EDL
CEL : CE, CDE
ED : PXE, CE, EL
SUB_3 : SUB1_3, BRL, SUB2_3

DSL : DE, SE, AUE
EML : EL, EDL
PXL_4 : PXE, PXDE1_4, PXDE2
CEL : CE, CDE
ED : PXE, CE, EL

DSL : DE, SE, AUE
CCE_5 : CCE1_5, CCE2_5
PXL_5 : PXE_5, AUE_5
PXE_5 : PXE_5a, PXE_5b, PXE_5c
EML : EL, EDL
CEK : CE, CDE
ED : PXE, CE, EL

DISPLAY DEVICE AND METHOD OF MANUFACTURING THE SAME

CROSS REFERENCE TO RELATED APPLICATION(S)

This application claims priority from to and benefits of Korean Patent Application No. 10-2022-0122939 under 35 U.S.C. § 119, filed on Sep. 28, 2022, in the Korean Intellectual Property Office, the entire contents of which are incorporated herein by reference.

BACKGROUND

1. Technical Field

Embodiments relate to a display device and a method of manufacturing the display device.

2. Description of the Related Art

Display devices have been more important with the development of multimedia. Accordingly, various types of display devices such as organic light emitting displays and liquid crystal displays have been used in various fields.

A display device includes a display panel such as an organic light emitting display panel or a liquid crystal display panel as a device for displaying an image of the display device. Among them, a light emitting display panel may include light emitting elements such as light emitting diodes (LEDs). For example, the LEDs may be organic light emitting diodes (OLEDs) formed of an organic material as a fluorescent material or may be inorganic LEDs formed of an inorganic material as a fluorescent material.

The display device includes a pixel electrode and a common electrode. The pixel electrode is individually driven for each pixel by a thin-film transistor. The same voltage is applied to the common electrode regardless of the pixels. As a display screen becomes larger, the size of the common electrode also increases. For example, a voltage drop phenomenon may occur due to the resistance of the common electrode itself, thereby deteriorating display quality.

SUMMARY

Embodiments provide a display device which reduces a voltage drop phenomenon of a common electrode.

Embodiments also provide a method of manufacturing a display device which reduces a voltage drop phenomenon of a common electrode.

However, embodiments of the disclosure are not limited to those set forth herein. The above and other embodiments of the disclosure will become more apparent to one of ordinary skill in the art to which the disclosure pertains by referencing the detailed description of the disclosure given below.

In an embodiment, display device may include a thin-film transistor disposed on a substrate, an interlayer insulating layer disposed on the thin-film transistor, a source/drain electrode and an auxiliary electrode that are formed as a same layer disposed on the interlayer insulating layer, each of the source/drain electrode and the auxiliary electrode including a first conductive layer and a second conductive layer disposed on an upper surface of the first conductive layer, a via insulating layer disposed on the interlayer insulating layer and the source/drain electrode and having a first opening exposing the auxiliary electrode, a capping layer covering at least a portion of the auxiliary electrode and a light emitting material layer and a common electrode layer sequentially stacked on an upper surface of the via insulating layer and an upper surface of the capping layer, and the source/drain electrode may be electrically connected to the thin-film transistor through a contact hole penetrating the interlayer insulating layer, the auxiliary electrode may have an undercut shape in which side surfaces of the first conductive layer of the auxiliary electrode are disposed inside side surfaces of the second conductive layer of the auxiliary electrode, the capping layer may include a first capping layer covering the side surfaces of the first conductive layer of the auxiliary electrode and a second capping layer separated from the first capping layer and disposed on an upper surface of the second conductive layer of the auxiliary electrode, and the capping layer may include a conductive material.

The display device may further include: a pixel electrode layer disposed between the via insulating layer and each of the capping layer and the light emitting material layer, wherein the pixel electrode layer may include: a pixel electrode electrically connected to the source/drain electrode through a contact hole penetrating the via insulating layer, a first dummy pixel electrode separated from the pixel electrode and disposed on the first capping layer, and a second dummy pixel electrode separated from the first dummy pixel electrode and disposed on the second capping layer.

The light emitting material layer may include: a first portion disposed on the first dummy pixel electrode; and a second portion separated from the first portion of the light emitting material layer and disposed on the second dummy pixel electrode.

The common electrode layer may include: a first portion disposed on the first portion of the light emitting material layer and directly contacting the first capping layer, and a second portion separated from the first portion of the common electrode layer and disposed on the second portion of the light emitting material layer.

The display device may further include: a pixel electrode disposed on the via insulating layer and electrically connected to the source/drain electrode through a contact hole penetrating the via insulating layer, wherein the capping layer and the pixel electrode may be formed of a same material.

The light emitting material layer may include: a first portion disposed on the first capping layer; and a second portion separated from the first portion of the light emitting material layer and disposed on the second capping layer.

The auxiliary electrode may further include a third conductive layer disposed between the first conductive layer of the auxiliary electrode and the interlayer insulating layer, and the side surfaces of the first conductive layer of the auxiliary electrode may be disposed inside side surfaces of the third conductive layer of the auxiliary electrode.

A thickness of the first capping layer covering the side surfaces of the first conductive layer may decrease as the first capping layer is closer to the second conductive layer.

A bottom surface of the second conductive layer of the auxiliary electrode may include a surface exposed from the first conductive layer of the auxiliary electrode, and the first capping layer does not contact the exposed surface of the bottom surface of the second conductive layer.

The capping layer may include at least any one of titanium (Ti), molybdenum (Mo), and a conductive oxide.

The second conductive layer and the third conductive layer may include at least any one of titanium (Ti), molybdenum (Mo) and a conductive oxide, the first conductive layer may include at least any one of aluminum (Al) and copper (Cu), and a thickness of the second conductive layer and a thickness of the third conductive layer may be smaller than a thickness of the first conductive layer.

A bottom surface of the second conductive layer of the auxiliary electrode may include a surface exposed from the first conductive layer of the auxiliary electrode, and the first capping layer may contact a portion of the exposed surface of the bottom surface of the second conductive layer of the auxiliary electrode.

In an embodiment, a display device may include a thin-film transistor disposed on a substrate, an interlayer insulating layer disposed on the thin-film transistor, a source/drain electrode disposed on the interlayer insulating layer and electrically connected to the thin-film transistor through a contact hole penetrating the interlayer insulating layer, a via insulating layer disposed on the source/drain electrode, a pixel electrode and an auxiliary electrode that are formed as a same layer disposed on the via insulating layer, each of the pixel electrode and the auxiliary electrode including a first conductive layer and a second conductive layer disposed on an upper surface of the first conductive layer, a pixel defining layer disposed on the via insulating layer and the pixel electrode and having a first opening exposing the auxiliary electrode, a capping layer covering at least a portion of the auxiliary electrode and a light emitting material layer and a common electrode layer sequentially stacked on the pixel defining layer and the capping layer, wherein the pixel electrode may be electrically connected to the source/drain electrode through a contact hole penetrating the via insulating layer, the auxiliary electrode may have an undercut shape in which side surfaces of the first conductive layer of the auxiliary electrode are disposed inside side surfaces of the second conductive layer of the auxiliary electrode, the capping layer may include a first capping layer covering the side surfaces of the first conductive layer of the auxiliary electrode and a second capping layer separated from the first capping layer and disposed on an upper surface of the second conductive layer of the auxiliary electrode, and the capping layer may include a conductive material.

The light emitting material layer may include: a first portion disposed on the first capping layer; and a second portion separated from the first portion of the light emitting material layer and disposed on the second capping layer.

The common electrode layer may include: a first portion disposed on the first portion of the light emitting material layer and directly contacting the first capping layer, and a second portion separated from the first portion of the common electrode layer and disposed on the second portion of the light emitting material layer.

The auxiliary electrode may further include a third conductive layer disposed between the first conductive layer of the auxiliary electrode and the interlayer insulating layer, and the side surfaces of the first conductive layer of the auxiliary electrode may be disposed inside side surfaces of the third conductive layer of the auxiliary electrode.

A thickness of the first capping layer covering the side surfaces of the first conductive layer may decrease as the first capping layer is closer to the second conductive layer.

In an embodiment, a method of manufacturing of a display device may include forming a thin-film transistor on a substrate, forming an interlayer insulating layer on the thin-film transistor, forming a source/drain electrode and an auxiliary electrode, each of the source/drain electrode and the auxiliary electrode including a first conductive layer and a second conductive layer disposed on an upper surface of the first conductive layer, on the interlayer insulating layer as a same layer, forming a via insulating layer including a first opening exposing the auxiliary electrode, on the interlayer insulating layer and the source/drain electrode, etching the first conductive layer of the auxiliary electrode to form an undercut structure in which side surfaces of the first conductive layer of the auxiliary electrode are disposed inside side surfaces of the second conductive layer of the auxiliary electrode, forming a capping layer including a first capping layer covering the side surfaces of the first conductive layer of the auxiliary electrode and a second capping layer separated from the first capping layer and disposed on an upper surface of the second conductive layer of the auxiliary electrode, and sequentially forming a pixel electrode layer, a light emitting material layer and a common electrode layer on the capping layer.

The forming of the capping layer may be performed by a sputtering method.

The capping layer may include at least any one of titanium (Ti), molybdenum (Mo), and a conductive oxide.

In a display device according to an embodiment, the display device according to an embodiment may reduce a voltage drop phenomenon of a common electrode.

In a method of manufacturing of a display device according to an embodiment, A display device in which a voltage drop phenomenon of the common electrode is reduced may be provided.

However, the effects of the disclosure are not limited to the aforementioned effects, and various other effects are included in the description.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
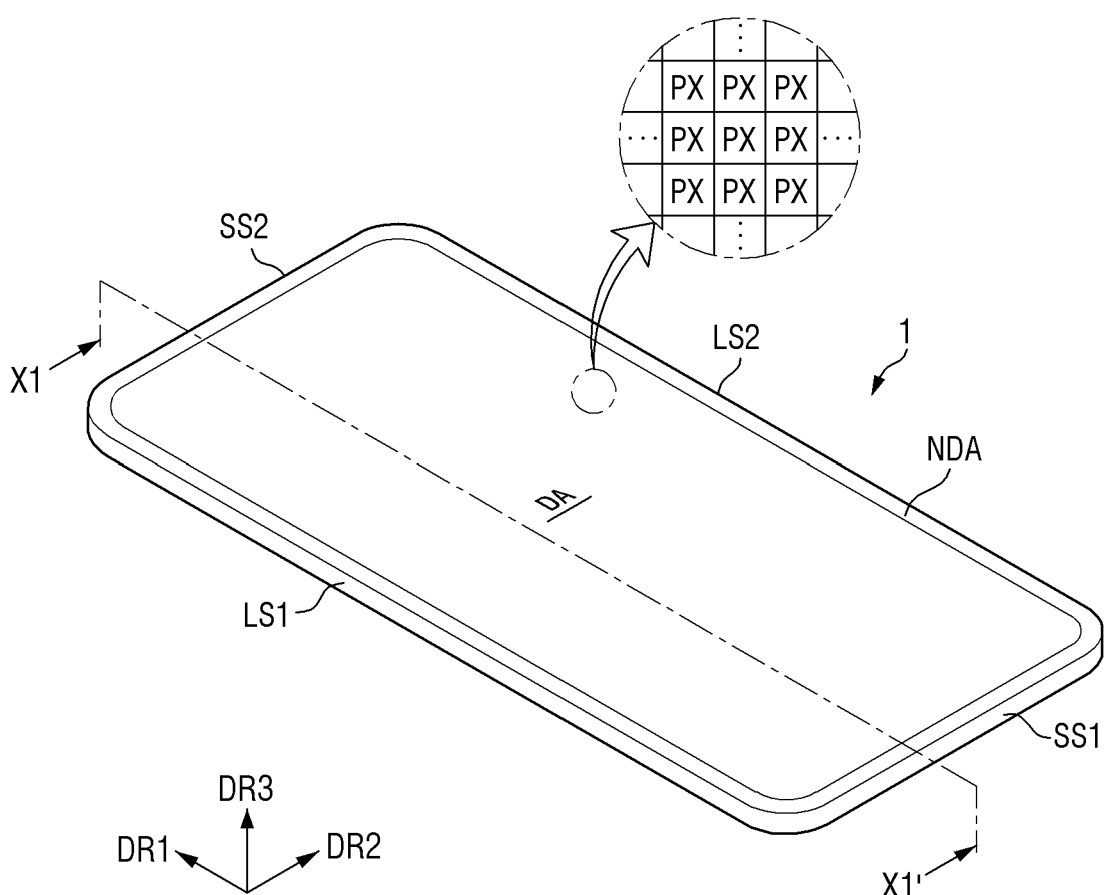
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, specific embodiments will be described with reference to the accompanying drawings.

FIG. 1 is a schematic perspective view of a display device 1 according to an embodiment.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an up-down direction in the drawing, that is, a thickness direction. In the following description, unless otherwise specified, a "direction" may refer to directions (e.g., opposite directions) extending to sides (e.g., opposite sides) along the direction. In case that it is necessary to distinguish the "directions" extending to the sides, a first side is referred to as a "first side in the direction," and a second side is referred to as a "second side in the direction." Based on FIG. 1, a direction in which an arrow is directed is referred to as the first side, and a direction opposite to the direction is referred to as the second side. However, directions mentioned in embodiments should be understood as relative directions, and the embodiments are not limited to the mentioned directions.

Hereinafter, for descriptive convenience, in referring to surfaces of the display device 1 or each member constituting the display device 1, one surface facing the first side in a direction in which an image is displayed, that is, in the third direction DR3 is referred to as a top surface, and a surface opposite the one surface is referred to as a bottom surface. However, embodiments are not limited thereto, and the one surface and the other surface of each member may also be referred to as a front surface and a rear surface or as a first surface and a second surface, respectively. In describing relative positions of the members of the display device 1, the first side in the third direction DR3 may be referred to as an upper side, and the second side in the third direction DR3 may be referred to as a lower side.

The display device 1 may include any electronic device that provides a display screen. Examples of the display device 1 may include a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, a television, a notebook computer, a netbook, a monitor, a billboard, and the Internet of things (IoT), all of which provide a display screen. The embodiment shows an example in which the display device 1 is applied to a medium-sized portable device such as a tablet PC.

The planar shape of the display device 1 is not limited thereto. For example, the planar shape of the display device 1 may be modified to various shapes such as a rectangle, a square, a rhombus, other polygons, a circle, and an oval according to the field to which the display device 1 is applied. The planar shape of the display device 1 may be a rectangle with rounded corners, and long sides LS1 and LS2 may be parallel to the first direction DR1. For descriptive convenience, a long side positioned on a side (e.g., a left side in plan view in the drawing) among two facing long sides of the rectangle will be referred to as a first long side LS1, and a long side positioned on another side (e.g., a right side in plan view in the drawing) will be referred to as a second long side LS2. For example, a short side positioned on a side (e.g., a lower side in plan view in the drawing) among two short sides facing each other will be referred to as a first short side SS1, and a short side positioned on another side (e.g., an upper side in plan view in the drawing) will be referred to as a second short side SS2. The terms "the first long side LS1," "the second long side LS2," "the first short side SS1," and "the second short side SS2" will be used to refer to corresponding sides of not only the display device 1 but also an element included in the display device 1 in case that the element has a shape and positional structure similar to those of the display device 1.

The display device 1 may include a display area DA and a non-display area NDA. The display area DA may be an area where a screen is displayed, and the non-display area NDA may be an area where no screen is displayed. The non-display area NDA may be disposed around the display area DA. In case that the display area DA has a rectangular shape, the non-display area NDA may surround four sides of the display area DA. However, embodiments are not limited thereto. For example, the non-display area NDA may also be disposed outside only some sides of the display area DA. In some cases, the non-display area NDA may be disposed inside the display area DA and may be surrounded by the display area DA.

Figure 2:
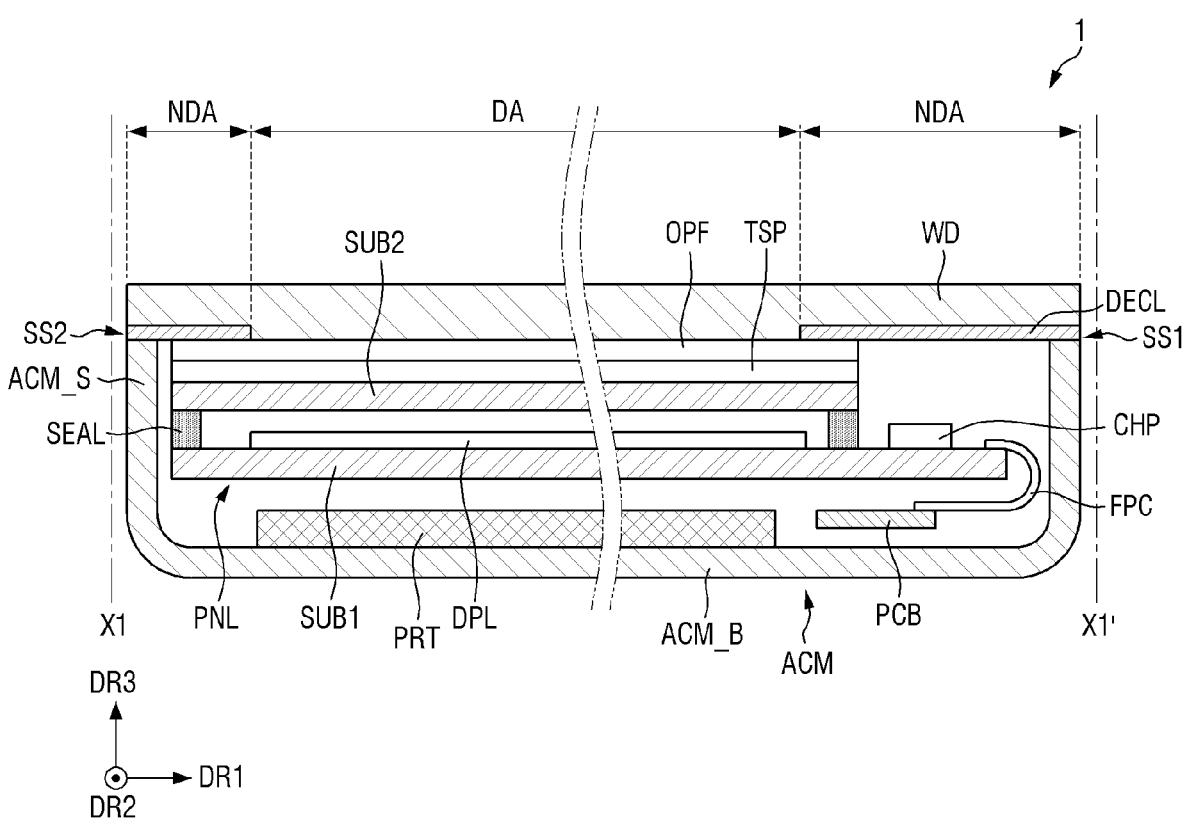
FIG. 2 is a schematic cross-sectional view taken along line X1-X1' of FIG. 1.

FIG. 2 is a schematic cross-sectional view taken along line X1-X1' of FIG. 1.

Referring to FIGS. 1 and 2, the display device 1 may include a display panel PNL. The display device 1 may further include a driver connected to the display panel PNL, an accommodating container ACM accommodating the display panel PNL and the driver, and an optical member OPF disposed on the display panel PNL.

In the description, the term "connect" may mean that any one member and another member are connected to each other not only through physical contact but also through another member. For example, it may be understood that any one part and another part are connected to each other as a single integrated member. Further, the connection between any one member and another member may be interpreted to include electrical connection through another member in addition to connection through direct contact.

The display panel PNL may include a display screen displaying an image. In the display device 1, a direction in which the display panel PNL displays the image may be the first side in the third direction DR3. The display panel PNL may have a planar shape substantially similar to that of the display device 1.

Examples of the display panel PNL may include an organic light emitting display panel, a micro light emitting diode (LED) display panel, a nano LED display panel, a quantum dot light emitting display panel, a liquid crystal display panel, a plasma display panel, a field emission display panel, an electrophoretic display panel, and an electrowetting display panel. A case where an organic light emitting display panel is applied as an example of the display panel PNL will be described below, but embodiments are not limited to this case, and other display panels may be used.

The display panel PNL may include a first substrate SUB1 and a display layer DPL disposed on the first substrate SUB1. The display panel PNL may further include a second substrate SUB2 facing the first substrate SUB1 and a sealing member SEAL bonding the first substrate SUB1 and the second substrate SUB2 together at an edge portion of the display panel PNL. The second substrate SUB2 may be spaced apart from an upper surface of the display layer DPL. For example, a space between the second substrate SUB2 and the display layer DPL may be empty, may be filled with a gas such as air, or may be filled with a solid filler. In another example, the second substrate SUB2 and the upper surface of the display layer DPL may contact each other.

The first substrate SUB1 may provide a space in which the display layer DPL is disposed. The first substrate SUB1 may be an insulating substrate or a semiconductor substrate. The first substrate SUB1 may be a rigid substrate. For example, the first substrate SUB1 may include glass.

The second substrate SUB2 may be disposed above the display layer DPL to protect the display layer DPL. The second substrate SUB2 may be an encapsulation substrate that prevents moisture permeation or gas inflow. Since the second substrate SUB2 is placed in a display direction of the display layer DPL, a transparent insulating substrate may be applied as the second substrate SUB2. For example, the second substrate SUB2 may include glass.

The sealing member SEAL may be disposed at an edge portion of the first substrate SUB1 and the second substrate SUB2 and may bond the first substrate SUB1 and the second substrate SUB2 together. The sealing member SEAL may have an encapsulation function to prevent moisture permeation or gas inflow in a lateral direction of the display panel PNL. The sealing member SEAL may include, for example, frit, a photocurable resin, or a thermosetting resin.

An inner space defined by the first substrate SUB1, the second substrate SUB2, and the sealing member SEAL may be sealed. The display layer DPL may be disposed in the sealed inner space.

The display layer DPL may be divided into pixels PX in plan view. The pixels PX may include color pixels. For example, the pixels PX may include red pixels, green pixels, and blue pixels that are arranged alternately.

The driver may drive the operation of the display panel PNL. At least some elements of the driver may drive the pixels PX of the display layer DPL.

The driver may be implemented in the form of a chip, a film, and/or a circuit board. For example, the driver may include a driving chip CHP, a first printed circuit board FPC, and a second printed circuit board PCB. The first printed circuit board FPC may be a flexible printed circuit board, and the second printed circuit board PCB may be a rigid printed circuit board, but embodiments are not limited thereto.

The driving chip CHP and/or the first printed circuit board FPC may be mounted on the first substrate SUB1. For example, each of the driving chip CHP and the first printed circuit board FPC may be electrically connected and attached to a pad electrode disposed in the display layer DPL on the first substrate SUB1 through an anisotropic conductive film or ultrasonic bonding. The second printed circuit board PCB may be attached to an end portion of the first printed circuit board FPC. As illustrated in FIG. 2, the first printed circuit board FPC may be bent toward under the first substrate SUB1, and the second printed circuit board PCB attached to the first printed circuit board FPC may be disposed under the first substrate SUB1.

Although a case where the driving chip CHP is mounted on the first substrate SUB1 is illustrated in FIG. 2, the driving chip CHP may also be mounted on the first printed circuit board FPC.

The driving chip CHP and the first printed circuit board FPC are mounted on an end portion of the first substrate SUB1. In the first substrate SUB1, an area where the driving chip CHP is mounted (hereinafter, referred to as a mounting area) may be disposed adjacent to the first short side SS1 positioned on the first side in the first direction DR1. However, embodiments are not limited thereto, and the mounting area may also be disposed adjacent to the long sides LS1 and LS2.

The mounting area of the first substrate SUB1 may be positioned outside the sealing member SEAL. Since the mounting area of the first substrate SUB1 is positioned in the non-display area NDA, the non-display area NDA on the first short side SS1 where the mounting area of the first substrate SUB1 is positioned in the display device 1 may have a relatively greater width than the non-display area NDA on the other sides LS1, LS2, and SS2.

The mounting area of the first substrate SUB1 may not overlap the second substrate SUB2. For example, the first short side SS1 where the mounting area of the first substrate SUB1 is positioned may protrude outward from a corresponding first short side SS1 of the second substrate SUB2. Sides LS1, LS2 and SS2 other than the short side SS1 where the mounting area of the first substrate SUB1 is positioned may be aligned with corresponding sides LS1, LS2 and SS2 of the second substrate SUB2 and the sealing member SEAL.

The display device 1 may further include a touch member TSP. The touch member TSP may be implemented as a separate film or panel and attached onto a surface of the second substrate SUB2 of the display panel PNL or may be formed (e.g., directly formed) on the surface of the second substrate SUB2 of the display panel PNL in the form of a layer.

The optical member OPF may be disposed on the display panel PNL. An example of the optical member OPF may be a polarizing member. The polarizing member may reduce reflection of external light. The polarizing member may be implemented in the form of a film and attached onto the display panel PNL. Other examples of the optical member OPF may include a viewing angle control film and a lenticular film for implementing a 3D image, but embodiments are not limited thereto. The optical member OPF may include two or more members having an optical function.

The display device 1 may further include a window member WD. The window member WD may be disposed on the display panel PNL to protect the display panel PNL from external impact. The window member WD may form the exterior of an upper surface of the display device 1. In case that the display device 1 includes the optical member OPF, the window member WD may be disposed on the optical member OPF. For example, an optical film such as an anti-fingerprint film may be further disposed on the window member WD.

The window member WD may cover the display panel PNL in plan view. The window member WD may cover not only the second substrate SUB2 but also the first short side SS1 of the first substrate SUB1 protruding from the first short side SS1 of the second substrate SUB2. The window member WD may further include a printed layer DECL disposed along edge portions thereof. The printed layer DECL may be disposed in the non-display area NDA to define a bezel of the display device 1. Furthermore, the printed layer DELC may function as a decorative layer that enhances the exterior of the display device 1 and may cover a structure thereunder and prevent light leakage.

The accommodating container ACM may be disposed under the display panel PNL to accommodate the display panel PNL, the first printed circuit board FPC, and the second printed circuit board PCB. The accommodating container ACM may include a bottom portion ACM_B and sidewall portions ACM_S extending from edge portions of the bottom portion ACM_B in the third direction DR3. Upper end portions of the sidewall portions ACM_S may be coupled to a lower surface of the window member WD through a coupling member such as an adhesive layer. In plan view, the sidewall portions ACM_S may be covered (e.g., completely covered) by the window member WD. Unlike in the drawing, the sidewall portions ACM_S may also be coupled to side surfaces of the window member WD.

An empty space may be disposed between the bottom portion ACM_B of the accommodating container ACM and the display panel PNL, and components PRT, such as a battery, may be further accommodated in the empty space.

Figure 3:
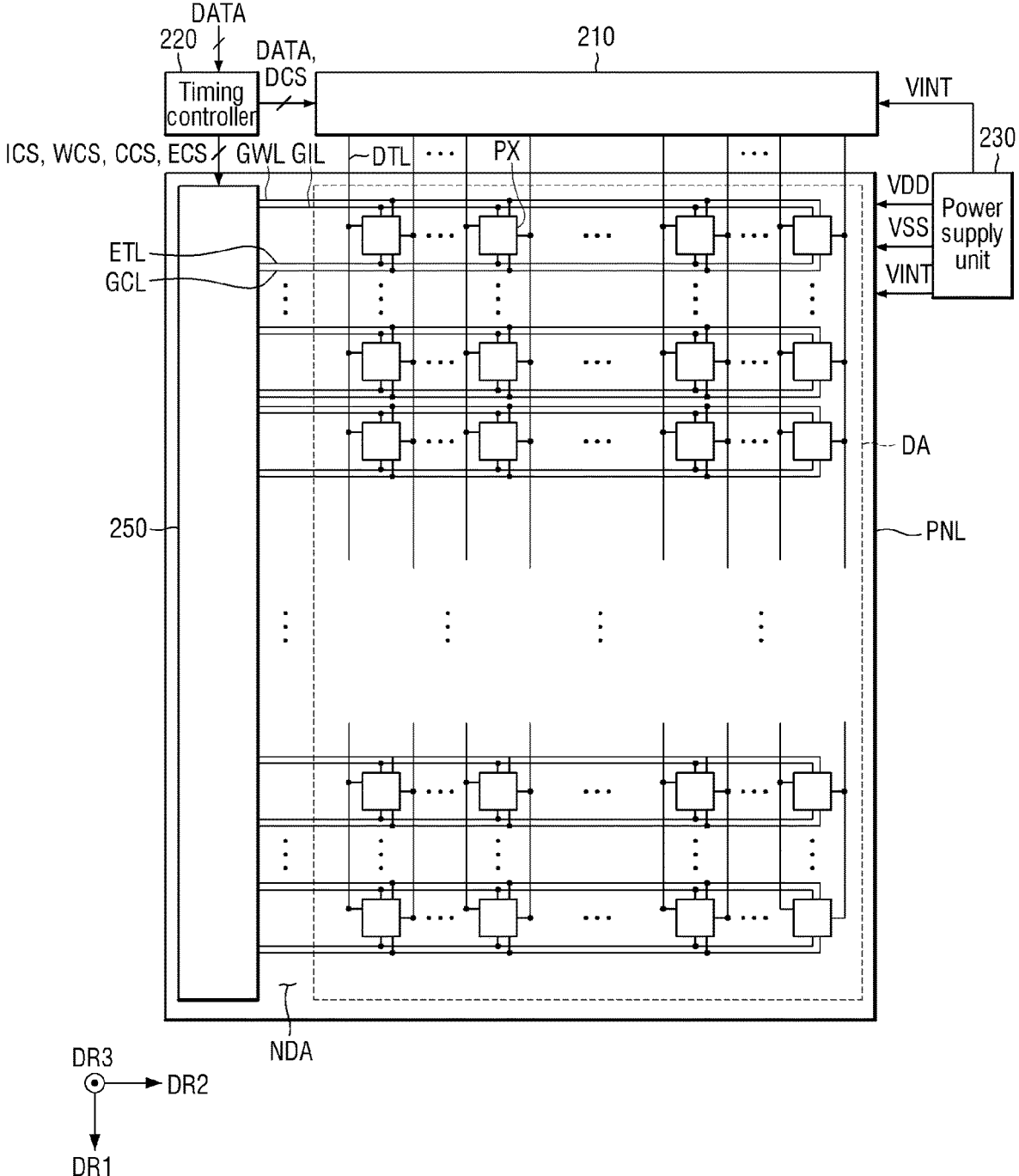
FIG. 3 is a schematic block diagram of the display device according to an embodiment.

FIG. 3 is a schematic block diagram of the display device 1 according to an embodiment.

Referring to FIG. 3, the display area DA of the display device 1 may include pixels PX arranged in a matrix shape. Drivers may include a display scan driver 250, a data driver 210, a timing controller 220, and a power supply unit 230. Although the drivers are positioned in the non-display area NDA, some of the drivers may also be disposed in the display area DPA.

In the display area DA, not only the pixels PX but also wirings connected from the drivers are disposed. The wirings may include display write wirings GWL, display initialization wirings GIL, display control wirings GCL, emission wirings ETL, and data wirings DTL.

The data wirings DTL may extend in the first direction DR1. The display write wirings GWL, the display initialization wirings GIL, the display control wirings GCL, and the emission wirings ETL may extend in the second direction DR2.

Each of the pixels PX may be connected to any one of the display write wirings GWL, any one of the display initialization wirings GIL, any one of the display control wirings GCL, and any one of the emission wirings ETL. Each of the pixels PX may receive a data voltage of a data wiring DTL according to a display write signal of a display write wiring GWL, a display initialization signal of a display initialization wiring GIL, a display control signal of a display control wiring GCL and an emission signal of an emission wiring ETL and may emit light by supplying a driving current to a light emitting element according to the data voltage.

The display scan driver 250 may be connected to the display write wirings GWL, the display initialization wirings GIL, the display control wirings GCL, and the emission wirings ETL. The display scan driver 250 may include a display signal output unit and an emission signal output unit. The display signal output unit may output display write signals transmitted to the display write wirings GWL, display initialization signals transmitted to the display initialization wirings GIL, and display control signals transmitted to the display control wirings GCL. The emission signal output unit may output emission signals transmitted to the emission wirings ETL.

The display scan driver 250 may receive a write control signal WCS, an initialization control signal ICS, a scan control signal CCS, and an emission control signal ECS from the timing controller 220. The display signal output unit of the display scan driver 250 may generate display write signals according to the write control signal SCS and may output the display write signals to the display write wirings GWL. For example, the display signal output unit of the display scan driver 250 may generate display initialization signals according to the initialization control signal ICS and may output the display initialization signals to the display initialization wirings GIL. For example, the display signal output unit of the display scan driver 250 may generate display control signals according to the scan control signal CCS and may output the display control signals to the display control wirings GCL. Furthermore, the emission signal output unit of the display scan driver 250 may generate display emission signals according to the emission control signal ECS and may output the display emission signals to the emission wirings ETL.

The data driver 210 may convert digital video data DATA into data voltages and may output the data voltages to the data wirings DTL. The data driver 210 may output the data voltages in synchronization with the display write signals. Pixels PX may be selected by the display write signals of the display scan driver 250, and the data voltages may be supplied to the selected pixels PX, respectively.

The timing controller 220 may receive the digital video data DATA and timing signals from an external graphics device. For example, the external graphics device may be a graphic card of a computer or a set-top box, but embodiments are not limited thereto.

The timing controller 220 may generate the write control signal WCS, the initialization control signal ICS, the scan control signal CCS, and the emission control signal ECS for controlling the operation timing of the display scan driver 250 according to the timing signals. For example, the timing controller 220 may generate a data control signal DCS for controlling the operation timing of the data driver 210 according to the timing signals.

The timing controller 220 may output the write control signal WCS, the initialization control signal ICS, the scan control signal CCS, and the emission control signal ECS to the display scan driver 250. The timing controller 220 may output the digital video data DATA and the data control signal DCS to the data driver 210.

The power supply unit 230 may generate driving voltages and may output the driving voltages to the display area DA. The power supply unit 230 may output a first driving voltage VDD, a second driving voltage VSS, and a third driving voltage VINT to the display panel PNL. The first driving voltage VDD may be a high potential driving voltage, the second driving voltage VSS may be a low potential driving voltage, and the third driving voltage VINT may be a voltage for initializing a gate electrode of a driving transistor of each pixel PX.

Figure 4:
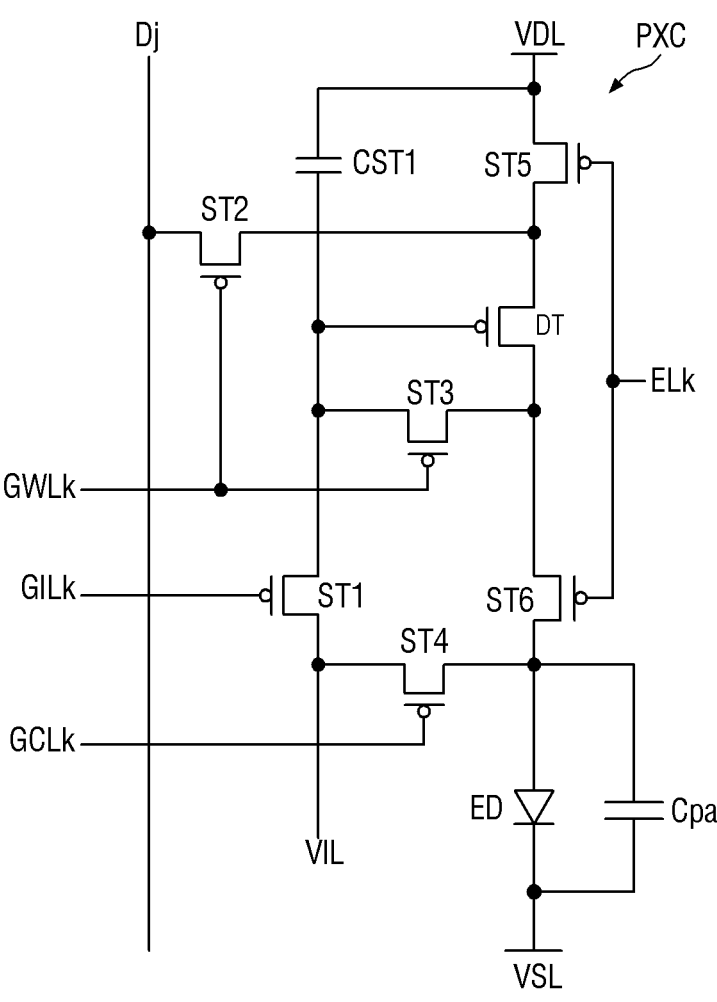
FIG. 4 is a schematic diagram of an equivalent circuit of a pixel according to an embodiment.

FIG. 4 is a schematic diagram of an equivalent circuit of a pixel PX according to an embodiment.

Referring to FIG. 4, the pixel PX according to an embodiment may be connected to a $k^{th}$ display initialization wiring GILk, a $k^{th}$ display write wiring GWLk, and a $k^{th}$ display control wiring GCLk. Here, k is a positive integer. For example, the pixel PX may be connected to a first driving voltage wiring VDL to which the first driving voltage VDD is supplied, a second driving voltage wiring VSL to which the second driving voltage VSS is supplied, and a third driving voltage wiring VIL to which the third driving voltage VINT is supplied.

A pixel circuit PXC may include a driving transistor DT, switch elements, and a capacitor CST1. The switch elements may include first through sixth transistors ST1 through ST6.

The driving transistor DT may include a gate electrode, a first electrode, and a second electrode. The driving transistor DT may control a drain-source current Ids (hereinafter, referred to as a "driving current") flowing between the first electrode and the second electrode according to a data voltage applied to the gate electrode. The driving current Ids flowing through a channel of the driving transistor DT may be proportional to the square of a difference voltage Vsg between the first electrode and the gate electrode of the driving transistor DT and a threshold voltage as shown in Equation 1.

$$Ids=k'\times(Vsg-Vth)^2$$

where k' is a proportional coefficient determined by the structure and physical characteristics of a driving transistor, Vsg is a voltage between a first electrode and a gate electrode of the driving transistor, and Vth is a threshold voltage of the driving transistor.

A light emitting element ED may emit light according to the driving current Ids. The amount of light emitted from the light emitting element ED may increase as the driving current Ids increases.

The light emitting element ED may be an organic light emitting diode including an organic light emitting layer disposed between an anode and a cathode. In another example, the light emitting element ED may be an inorganic light emitting element including an inorganic semiconductor disposed between an anode and a cathode. In another example, the light emitting element ED may be a quantum dot light emitting element including a quantum dot light emitting layer disposed between an anode and a cathode. In another example, the light emitting element ED may be a micro-light emitting element including a micro-light emitting diode disposed between an anode and a cathode.

The anode of the light emitting element ED may be connected to a first electrode of the fourth transistor ST4 and a second electrode of the sixth transistor ST6, and the cathode of the light emitting element ED may be connected to the second driving voltage wiring VSL. A parasitic capacitor Cpa may be formed between the anode and the cathode of the light emitting element ED.

The first transistor ST1 may be turned on by an initialization scan signal of the $k^{th}$ display initialization wiring GILk to connect the gate electrode of the driving transistor DT to the third driving voltage wiring VIL. Accordingly, the third driving voltage VINT of the third driving voltage wiring VIL may be applied to the gate electrode of the driving transistor DT. The first transistor ST1 may have a gate electrode connected to the $k^{th}$ display initialization wiring GILk, a first electrode connected to the gate electrode of the driving transistor DT, and a second electrode connected to the third driving voltage wiring VIL.

The second transistor ST2 may be turned on by a display write signal of the $k^{th}$ display write wiring GWLk to connect the first electrode of the driving transistor DT to a $j^{th}$ data wiring Dj. Accordingly, a data voltage of the $j^{th}$ data wiring Dj may be applied to the first electrode of the driving transistor DT. The second transistor ST2 may have a gate electrode connected to the $k^{th}$ display write wiring GWLk, a first electrode connected to the first electrode of the driving transistor DT, and a second electrode connected to the $j^{th}$ data wiring Dj.

The third transistor ST3 may be turned on by the display write signal of the $k^{th}$ display write wiring GWLk to connect the gate electrode and the second electrode of the driving transistor DT. In case that the gate electrode and the second electrode of the driving transistor DT are connected, the driving transistor DT may operate in a diode. The third transistor ST3 may have a gate electrode connected to the $k^{th}$ display write wiring GWLk, a first electrode connected to the second electrode of the driving transistor DT, and a second electrode connected to the gate electrode of the driving transistor DT.

The fourth transistor ST4 may be turned on by a display control signal of the $k^{th}$ display control wiring GCLk to connect the anode of the light emitting element ED to the third driving voltage wiring VIL. The third driving voltage VINT of the third driving voltage wiring VIL may be applied to the anode of the light emitting element ED. The fourth transistor ST4 may have a gate electrode connected to the $k^{th}$ display control wiring GCLk, the first electrode connected to the anode of the light emitting element ED, and a second electrode connected to the third driving voltage wiring VIL.

The fifth transistor ST5 may be turned on by an emission signal of a $k^{th}$ emission wiring ELk to connect the first electrode of the driving transistor DT to the first driving voltage wiring VDL. The fifth transistor ST5 may have a gate electrode connected to the $k^{th}$ emission wiring ELk, a first electrode connected to the first driving voltage wiring VDL, and a second electrode connected to the first electrode of the driving transistor DT.

The sixth transistor ST6 may be disposed between the second electrode of the driving transistor DT and the anode of the light emitting element ED. The sixth transistor ST6 may be turned on by the emission signal of the $k^{th}$ emission wiring ELk to connect the second electrode of the driving transistor DT to the anode of the light emitting element ED. The sixth transistor ST6 may have a gate electrode connected to the $k^{th}$ emission wiring ELk, a first electrode connected to the second electrode of the driving transistor DT, and the second electrode connected to the anode of the light emitting element ED.

In case that both the fifth transistor ST5 and the sixth transistor ST6 are turned on, the driving current Ids of the driving transistor DT according to the data voltage applied to the gate electrode of the driving transistor DT may flow to the light emitting element ED.

The capacitor CST1 may be formed between the gate electrode of the driving transistor DT and the first driving voltage wiring VDL. The capacitor CST1 may have a first capacitor electrode connected to the gate electrode of the driving transistor DT and a second capacitor electrode connected to the first driving voltage wiring VDL.

In case that the first electrode of each of the first through sixth transistors ST1 through ST6 and the driving transistor DT is a source electrode, the second electrode may be a drain electrode. In another example, in case that the first electrode of each of the first through sixth transistors ST1 through ST6 and the driving transistor DT is a drain electrode, the second electrode may be a source electrode. The terms "source electrode" and "drain electrode" may be changed according to the movement direction of carriers of a semiconductor layer. The first and second electrodes of the first through sixth transistors ST1 through ST6 and the driving transistor DT may be referred to as source/drain electrodes. In case that the first electrode and the second electrode need to be distinguished from each other, they may be referred to as a first source/drain electrode and a second source/drain electrode.

An active layer of each of the first through sixth transistors ST1 through ST6 and the driving transistor DT may be made of any one of polysilicon, amorphous silicon, and an oxide semiconductor. Although the first through sixth transistors ST1 through ST6 and the driving transistor DT are described as P-type metal oxide semiconductor field effect transistors (MOSFETs) in FIG. 4, embodiments are not limited thereto. For example, the first through sixth transistors ST1 through ST6 and the driving transistor DT may also be formed as N-type MOSFETs. In another example, at least one of the first through sixth transistors ST1 through ST6 may be formed as an N-type MOSFET.

In the above embodiment, a case where the pixel circuit PXC has a 7T-1C structure including seven transistors and one capacitor has been described. However, the number of transistors and capacitors constituting the pixel circuit PXC may be variously modified.

Referring to FIGS. 3 and 4, the anodes of the light emitting elements ED may be formed as separate pixel electrodes for the pixels PX, respectively, and connected to different driving transistors DT to receive voltages and/or currents. However, the cathodes of the light emitting elements ED may be formed as a common electrode commonly connected to the pixels PX. The common electrode may be in the form of a whole surface electrode disposed on the entire surface of the first substrate SUB1 (see FIG. 2). The common electrode may receive the second driving voltage VSS through the second driving voltage wiring VSL.

In some embodiments, the first driving voltage wiring VDL or the third driving voltage wiring VIL may extend across the display area DA in the shape of lines and may be connected to each pixel circuit PXC, but the second driving voltage wiring VSL may extend along the non-display area NDA around the display area DA. The common electrode may extend to the non-display area NDA so as to at least partially overlap the second driving voltage wiring VSL. The common electrode may be electrically connected to the second driving voltage wiring VSL through a contact hole in an area overlapping the second driving voltage wiring VSL and may receive the second driving voltage VSS. However, since a point or area where the common electrode is electrically connected to the second driving voltage wiring VSL is disposed in the non-display area NDA, a phenomenon (e.g., an IR drop phenomenon) in which the magnitude of the second driving voltage VSS decreases as the distance from the second driving voltage wiring VSL increases may occur due to the resistance of the common electrode itself. A voltage drop may also occur in other wirings. However, a light-transmitting conductive material (such as ITO) applied to the common electrode in case that light transmittance is required of the common electrode may have greater resistance than other wirings, thereby increasing the voltage drop phenomenon.

In order to reduce the voltage drop phenomenon of the common electrode, an auxiliary electrode may be additionally formed as described in detail below. The auxiliary electrode may be electrically connected to the common electrode to reduce the resistance of the common electrode. Since the second driving voltage VSS is directly provided to the auxiliary electrode, a voltage drop of the common electrode may be significantly reduced. However, although the second driving voltage VSS is not provided, the auxiliary electrode may reduce the resistance of the common electrode only by being electrically connected to the common electrode. Therefore, the auxiliary electrode may reduce the voltage drop phenomenon. The auxiliary electrode may be disposed across the display area DA in a line form and electrically connected to the common electrode in the display area DA. Therefore, the auxiliary electrode may reduce the resistance of the common electrode in the display area DA where a voltage drop is likely to occur because the display area DA is far away from the second driving voltage wiring VSL positioned in the non-display area NDA.

Figure 5:
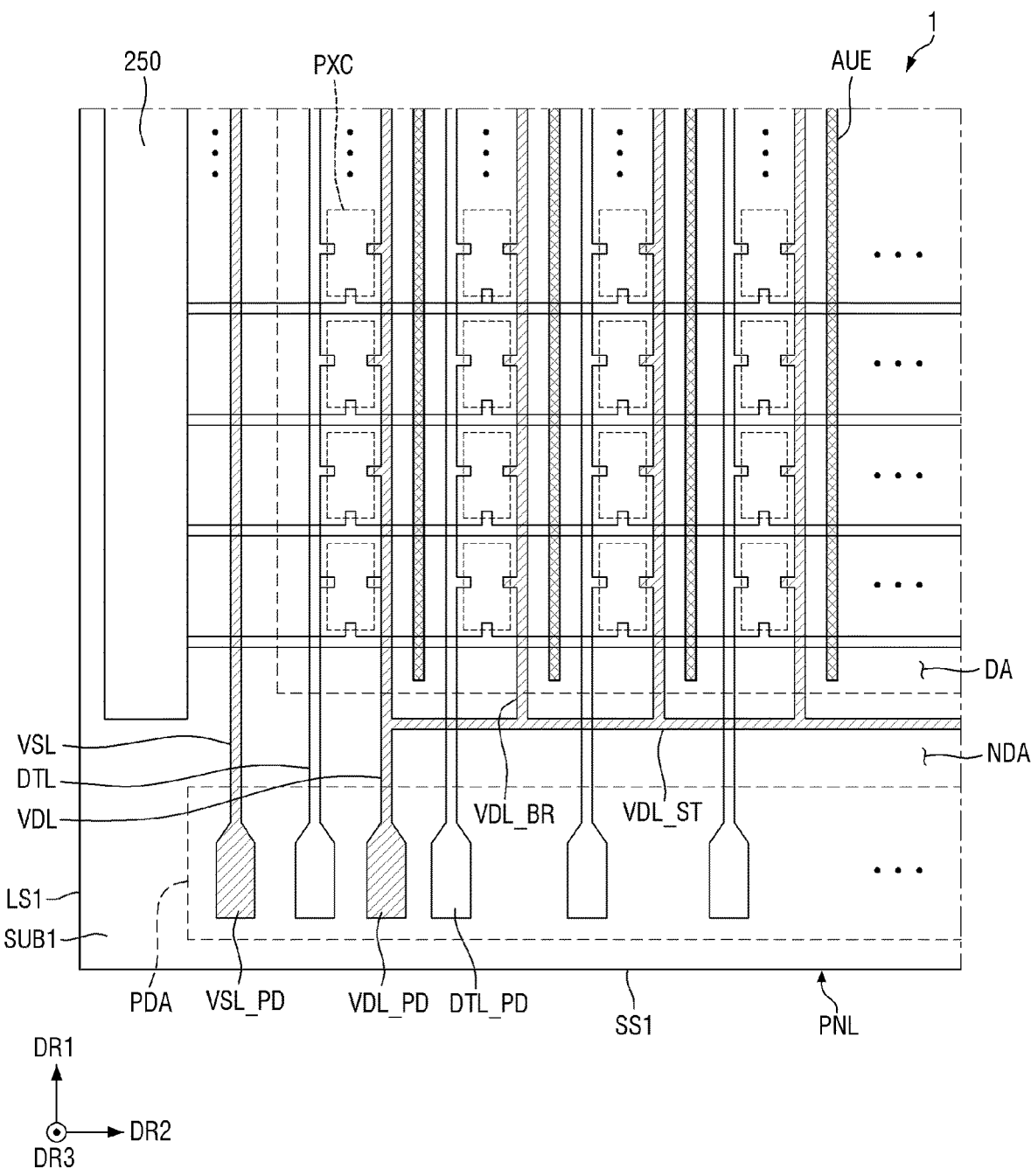
FIG. 5 is a schematic partial layout view of a display panel of the display device according to an embodiment.

FIG. 5 is a schematic partial layout view of the display panel PNL of the display device 1 according to an embodiment. In FIG. 5, the arrangement of the display write wirings GWL, the data wirings DTL, the first driving voltage wiring VDL, the second driving voltage wiring VSL, and auxiliary electrodes AUE among wirings or electrodes is illustrated for descriptive convenience.

Referring to FIG. 5, a pad area PDA may be disposed in the non-display area NDA adjacent to the first short side SS1 of the first substrate SUB1. Pad electrodes may be disposed in the pad area PDA. The pad electrodes may include data pads DTL_PD, at least one first driving voltage pad VDL_PD, and at least one second driving voltage pad VSL_PD.

The data wirings DTL may be connected to the data pads DTL_PD, respectively, and may extend toward the display area DA. The data wirings DTL may extend in the first direction DR1 and may be disposed between columns of the pixels PX. Each of the data wirings DTL may be connected to pixel circuits PXC disposed around the data wiring DTL along the extending direction. A single data wiring DTL may be disposed between every two columns of the pixels PX. However, embodiments are not limited thereto, and data wirings DTL may also be disposed side by side between two columns of the pixels PX, and the data wirings DTL may not be disposed between some columns of the pixels PX.

The first driving voltage wiring VDL may be connected to the first driving voltage pad VDL_PD. The first driving voltage wiring VDL may include a stem wiring VDL_ST connected to the first driving voltage pad VDL_PD and branch wirings VDL_BR branching from the stem wiring VDL_ST. Each branch wiring VDL_BR may be electrically connected to the stem wiring VDL_ST. Like the data wirings DTL, each branch wiring VDL_BR may extend toward the display area DA along the second direction DR2 and may be disposed between the columns of the pixels PX. Each of the branch wirings VDL_BR may be connected to pixel circuits PXC disposed around the branch wiring VDL_BR along the extending direction.

The second driving voltage wiring VSL may be connected to the second driving voltage pad VSL_PD. The second driving voltage wiring VSL may extend in the second direction DR2 along the non-display area NDA adjacent to the first long side LS1 and/or the second long side LS2 of the display panel PNL. The second driving voltage wiring VSL may not extend to the display area DA.

The auxiliary electrodes AUE may extend along the first direction DR1. The auxiliary electrodes AUE may be disposed between the columns of the pixels PX. In an embodiment, one auxiliary electrode AUE may be disposed between every two columns of the pixels PX, but embodiments are not limited thereto. For example, auxiliary electrodes AUE may also be disposed side by side between two columns of the pixels PX. As another example, a single auxiliary electrode AUE may be disposed in each space between the columns of the pixels PX.

The auxiliary electrodes AUE may not be directly connected to the pads disposed in the pad area PDA as illustrated in the drawing. Instead, the auxiliary electrodes AUE may be electrically connected to the common electrode disposed thereon as will be described below. Since the common electrode is electrically connected to the second driving voltage wiring VSL, the auxiliary electrodes AUE may eventually be electrically connected to the second driving voltage pad VSL_PD via the common electrode and the second driving voltage wiring VSL.

The display write wirings GWL may extend in the second direction DR2. In the display area DA, the display write wirings GWL may intersect the data wirings DTL, the first driving voltage wiring VDL, and the auxiliary electrodes AUE. However, since the display write wirings GWL are made of a different conductive layer from the data wirings DTL, the first driving voltage wiring VDL and the auxiliary electrodes AUE with an insulating layer interposed therebetween, the display write wirings GWL may secure an insulation structure with them without a short circuit.

The display scan driver 250 may be disposed on the first long side LS1 and/or the second long side LS2 of the display panel PNL. The display scan driver 250 may be a circuit formed (e.g., directly formed) on the first substrate SUB1. However, embodiments are not limited thereto, and the display scan driver 250 may also be formed and mounted in the form of a chip.

In the illustrated example, the display scan driver 250 may be disposed outside the second driving voltage wiring VSL, and the display write wirings GWL may overlap and cross the second driving voltage wiring VSL. However, the positional relationship between the display scan driver 250 and the second driving voltage wiring VSL is not limited thereto.

Figure 6:
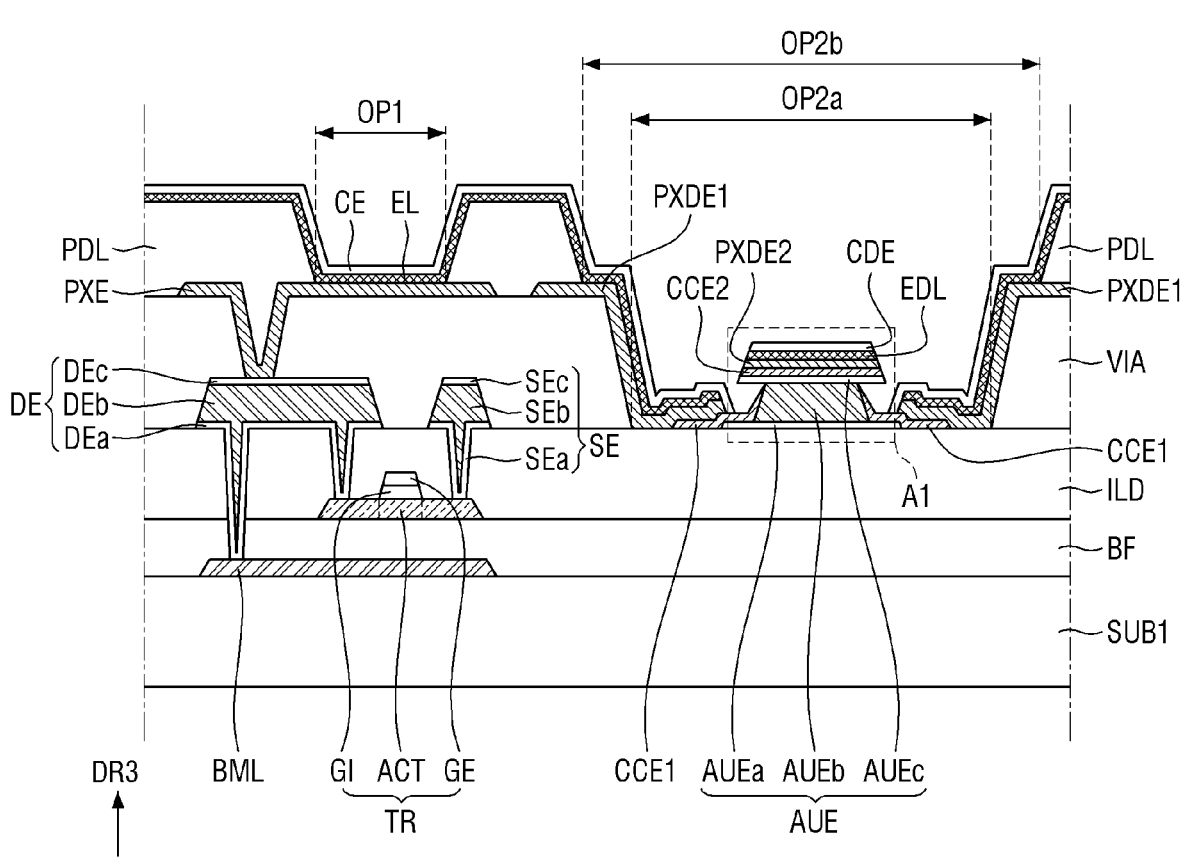
FIG. 6 is a schematic cross-sectional view illustrating the pixel structure of the display device according to an embodiment.

FIG. 6 is a schematic cross-sectional view illustrating the pixel structure of the display device 1 according to an embodiment. FIG. 6 illustrates the structure of a pixel PX and an auxiliary electrode AUE adjacent to the pixel PX. The structure of each of pixels PX and auxiliary electrodes AUE disposed in the display area DA may be substantially the same as the structure shown in FIG. 6.

In FIG. 6, the shape of a single thin-film transistor among thin-film transistors described with reference to FIG. 4 and the connection structure of the thin-film transistor are illustrated for descriptive convenience. The illustrated thin-film transistor may correspond to, for example, the driving transistor DT of FIG. 4. However, the illustrated connection structure of the thin-film transistor is only a possible connection structure of the thin-film transistor illustrated for convenience, and a specific connection structure of the thin-film transistor does not exactly match that of the driving transistor DT illustrated in FIG. 4. Except for the connection structure of the thin-film transistor, other transistors of FIG. 4 may also have substantially the same stacked structure as the thin-film transistor illustrated in FIG. 6.

The pixel structure of the display device 1 according to an embodiment will now be described with reference to FIG. 6.

The first substrate SUB1 may be an insulating substrate or a semiconductor substrate as described above. The first substrate SUB1 may be a rigid substrate. For example, the first substrate SUB1 may include glass.

A bottom metal layer BML may be disposed on the first substrate SUB1. The bottom metal layer BML may have a patterned shape and may overlap a semiconductor layer ACT thereon to function as a light-blocking metal layer that prevents light incident from below the bottom metal layer BML from being transferred to the semiconductor layer ACT. The bottom metal layer BML may be electrically connected to an electrode, e.g., a drain electrode DE of the thin-film transistor TR. In another example, the bottom metal layer BML may also be omitted.

A buffer layer BF may be disposed on the bottom metal layer BML. The buffer layer BF may be formed over the entire surface of the first substrate SUB1. The buffer layer BF may insulate the semiconductor layer ACT from the bottom metal layer BML. The buffer layer BF may include silicon nitride, silicon oxide, or silicon oxynitride.

The semiconductor layer ACT may be disposed on the buffer layer BF. As described above, the semiconductor layer ACT may overlap the bottom metal layer BML thereunder in the third direction DR3 which is in the thickness direction. The semiconductor layer ACT may include a first region, a second region, and a channel region disposed between the first region and the second region. The first region may be a source region, and the second region may be a drain region, and vice versa.

The semiconductor layer ACT may include polycrystalline silicon. In an embodiment, the semiconductor layer ACT may include monocrystalline silicon, low-temperature polycrystalline silicon, amorphous silicon, or an oxide semiconductor. The oxide semiconductor may include, for example, a binary compound ($AB_x$), a ternary compound ($AB_xC_y$) or a quaternary compound ($AB_xC_yD_z$) containing indium, zinc, gallium, tin, titanium, aluminum, hafnium (Hf), zirconium (Zr), magnesium (Mg), etc. In an embodiment, the semiconductor layer ACT may include indium tin zinc oxide (ITZO) such as an oxide including indium, tin, and zinc, or indium gallium zinc oxide (IGZO) such as an oxide including indium, gallium, and zinc.

A gate insulating layer GI may be disposed on the semiconductor layer ACT. The gate insulating layer GI may include a silicon compound, a metal oxide, or the like. For example, the gate insulating layer GI may include silicon oxide, silicon nitride, silicon oxynitride, aluminum oxide, tantalum oxide, hafnium oxide, zirconium oxide, titanium oxide, or the like. These materials may be used alone or in combination with each other. The gate insulating layer GI may be a single layer or a multilayer including stacked layers of different materials.

The gate insulating layer GI may be disposed on a region of the semiconductor layer ACT. For example, as illustrated in the drawing, the gate insulating layer GI may be disposed on the channel region of the semiconductor layer ACT but may expose the first region and the second region. For example, the gate insulating layer GI may overlap the channel region but may not overlap the first region and the second region. The gate insulating layer GI may have substantially the same planar shape as a gate electrode GE thereon.

As another example, the gate insulating layer GI may be disposed on the entire surface of the first substrate SUB1. For example, the gate insulating layer GI may cover the first region and the second region of the semiconductor layer ACT but may include contact holes exposing the first region and the second region so that a source electrode SE and the drain electrode DE may contact the semiconductor layer ACT.

A gate conductive layer may be disposed on the gate insulating layer GI. The gate conductive layer may include the gate electrode GE of the thin-film transistor TR. For example, the gate conductive layer may include a scan wiring connected to the gate electrode GE. For example, the display write wirings GWL, the display initialization wirings GIL, the display control wirings GCL, and the emission wirings ETL illustrated in FIG. 3 may be made of the gate conductive layer.

The gate electrode GE may at least partially overlap the channel region of the semiconductor layer ACT. Accordingly, the gate electrode GE and the semiconductor layer ACT may form a part of the thin-film transistor TR. The thin-film transistor TR may include the gate electrode GE, the semiconductor layer ACT, and the gate insulating layer GI between the gate electrode GE and the semiconductor layer ACT.

The gate conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an embodiment, the gate conductive layer may be a stacked layer of Mo/MoN.

An interlayer insulating layer ILD may be disposed on the gate conductive layer. The interlayer insulating layer ILD may include at least one of an inorganic layer including an inorganic insulating material, an organic layer including an organic insulating material, and an organic/inorganic composite layer including an inorganic insulating material and an organic insulating material. Examples of the inorganic insulating material may include silicon oxide, silicon nitride, silicon oxynitride, hafnium oxide, aluminum oxide, titanium oxide, tantalum oxide, and zinc oxide. Examples of the organic insulating material may include polyacrylates resin, epoxy resin, phenolic resin, polyamides resin, polyimides resin, unsaturated polyesters resin, polyphenylenethers resin, polyphenylenesulfides resin, and benzocyclobutene (BCB).

The interlayer insulating layer ILD may have a structure in which two or more layers selected from inorganic layers, organic layers, and organic/inorganic composite layers are stacked. In the drawing, an example in which one inorganic layer is applied as the interlayer insulating layer ILD is illustrated.

A data conductive layer DSL may be disposed on the interlayer insulating layer ILD. The data conductive layer DSL may include the source electrode SE and the drain electrode DE of the thin-film transistor TR and the auxiliary electrode AUE. The data conductive layer may further include the data wirings DTL illustrated in FIG. 3 and the first driving voltage wiring VDL. For example, the data conductive layer DSL may further include the second driving voltage wiring VSL and the third driving voltage wiring VIL.

The source electrode SE and the drain electrode DE of the thin-film transistor TR may be electrically connected to the first region and the second region of the semiconductor layer ACT through contact holes penetrating the interlayer insulating layer ILD. For example, the drain electrode DE of the thin-film transistor TR may be electrically connected to the bottom metal layer BML through a contact hole penetrating the interlayer insulating layer ILD and the buffer layer BF.

The data conductive layer DSL may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The data conductive layer DSL may be a multilayer. For example, the data conductive layer DSL may include a main conductive layer and may further include sub-conductive layers disposed under and/or on the main conductive layer. For example, the data conductive layer DSL may include a first sub-conductive layer, a main conductive layer disposed on the first sub-conductive layer, and a second sub-conductive layer disposed on the main conductive layer. The first sub-conductive layer may be a lower sub-conductive layer disposed on a bottom surface (or lower surface) of the main conductive layer, and the second sub-conductive layer may be an upper sub-conductive layer disposed on a top surface (or upper surface) of the main conductive layer.

The first sub-conductive layer of the data conductive layer DSL may include a lower conductive layer (or third conductive layer) DEa of the drain electrode DE, a lower conductive layer (or third conductive layer) SEa of the source electrode SE, and a lower conductive layer (or third conductive layer) AUEa of the auxiliary electrode AUE. The main conductive layer may include an intermediate conductive layer (or first conductive layer) DEb of the drain electrode DE, an intermediate conductive layer (or first conductive layer) SEb of the source electrode SE, and an intermediate conductive layer (or first conductive layer) AUEb of the auxiliary electrode AUE. The third sub-conductive layer may include an upper conductive layer (or second conductive layer) DEc of the drain electrode DE, an upper conductive layer (or second conductive layer) SEc of the source electrode SE, and an upper conductive layer (or second conductive layer) AUEc of the auxiliary electrode AUE.

The lower surface of the main conductive layer may contact (e.g., directly contact) an upper surface of the first sub-conductive layer, and the upper surface of the main conductive layer may contact (e.g., directly contact) a lower surface of the second sub-conductive layer.

The first sub-conductive layer may function as a barrier that prevents impurities, ions, moisture, etc. permeated from the interlayer insulating layer ILD or other structures thereunder from permeating into the main conductive layer. For example, the first sub-conductive layer may have greater adhesion to the interlayer insulating layer ILD than the main conductive layer, thereby increasing the adhesion of the data conductive layer DSL.

The main conductive layer may be a conductive layer that performs (e.g., mainly performs) signal transmission. For example, the main conductive layer may include a material having lower resistivity than those of the first sub-conductive layer and the second sub-conductive layer and may have a greater thickness.

The second sub-conductive layer may function as a barrier layer and/or a capping layer that protects the main conductive layer from chemicals used in a process performed after lamination of the main conductive layer or from impurities, ions, moisture, etc. permeated from structures and other elements on the second sub-conductive layer.

In some embodiments, the main conductive layer may include aluminum (Al) to a thickness of about 6000 Å, and the first sub-conductive layer and the second sub-conductive layer may include titanium (Ti) to a thickness of about 500 Å. However, embodiments are not limited thereto. For example, the main conductive layer may also include copper (Cu), the first sub-conductive layer may also include titanium (Ti), and the second sub-conductive layer may also include a transparent conductive oxide (e.g., ITO). For descriptive convenience, a case where the main conductive layer includes aluminum (Al) will be described below.

The first sub-conductive layer, the main conductive layer, and the second sub-conductive layer may have substantially the same pattern shape in plan view. For example, the phrase "substantially the same pattern shape" includes not only a case where sizes of patterns are completely the same, but also a case where the sizes of the patterns are slightly different but the overall extending shapes of the patterns in plan view are the same.

In a cross-sectional view taken in a width direction of some elements of the data conductive layer DSL such as the source electrode SE or the drain electrode DE of the thin-film transistor TR, side surfaces of the first sub-conductive layer, the main conductive layer, and the second sub-conductive layer may be substantially aligned with each other. For example, in case that side surfaces of conductive layers are aligned with each other, it does not necessarily mean that widths of the conductive layers completely overlap each other in plan view. For example, in case that side surfaces of the source electrode SE and the drain electrode DE have a substantially acute angle of inclination as illustrated by the source electrode SE and the drain electrode DE of FIG. 6, side surfaces of the lower conductive layer SEa, the intermediate conductive layer SEb and the upper conductive layer SEc of the source electrode SE may be seen as being substantially aligned with each other even though they are disposed on a plane inclined at an acute angle. Likewise, side surfaces of the lower conductive layer DEa, the intermediate conductive layer DEb and the upper conductive layer DEc of the drain electrode DE may be seen as being substantially aligned with each other even though they are disposed on a plane inclined at an acute angle.

For example, the data wirings DTL, the first driving voltage wiring VDL, and the second driving voltage wiring VSL may also have the same cross-sectional shape as the source electrode SE or the drain electrode DE.

In the auxiliary electrode AUE, unlike in the source electrode SE or the drain electrode DE, the side surfaces of the main conductive layer may be disposed inside the side surfaces of the first sub-conductive layer and the second sub-conductive layer. For example, a width of the intermediate conductive layer AUEb of the auxiliary electrode AUE may be smaller than widths of the lower conductive layer AUEa and the upper conductive layer AUEc in a cross section. This undercut structure in which side surfaces of the intermediate conductive layer AUEb are disposed inside side surfaces of the upper conductive layer AUEc on the intermediate conductive layer AUEb may function element layers on the auxiliary electrode AUE to be separated by the auxiliary electrode AUE. A specific shape of the auxiliary electrode AUE will be described in more detail below.

For example, another conductive layer may be further disposed between the bottom metal layer BML and the data conductive layer DSL.

In case that the illustrated gate conductive layer is referred to as a first gate conductive layer, for example, a second gate conductive layer used as an electrode of a capacitor may be further disposed between the first gate conductive layer and the data conductive layer DSL. In case that the display panel PNL includes heterogeneous transistors such as a polysilicon transistor and an oxide semiconductor transistor, a third gate conductive layer may be further disposed on or under the first gate conductive layer in addition to the first gate conductive layer used as the gate electrode GE of the polysilicon transistor. For example, the second gate conductive layer and/or the third gate conductive layer may have the same stacked structure as the first gate conductive layer. Other more gate conductive layers may also be formed.

In case that the illustrated data conductive layer DSL is referred to as a first data conductive layer, another data conductive layer for functioning as a wiring or an electrode that the data conductive layer DSL is responsible for herein may be disposed between the first data conductive layer and the gate conductive layer. For example, in case that a second data conductive layer and/or a third data conductive layer are disposed between the first data conductive layer and the gate conductive layer, the data wirings DTL, the source electrode SE, the drain electrode DE, the first driving voltage wiring VDL, the second driving voltage wiring VSL, and the third driving voltage wiring VIL may be made of any one of the first data conductive layer DSL, the second data conductive layer DSL, and the third data conductive layer DSL. However, for example, the auxiliary electrode AUE may be made of the first data conductive layer DSL that is positioned highest. Other more data conductive layers DSL may also be disposed.

A via insulating layer VIA (e.g., an organic insulating layer) may be disposed on the data conductive layer DSL. The via insulating layer VIA may have a flat upper surface. The via insulating layer VIA may cover the entire surface of the interlayer insulating layer ILD on which the data conductive layer DSL is disposed, except for an area where the auxiliary electrode AUE is disposed. In the area where the auxiliary electrode AUE is disposed, the via insulating layer VIA may have a via layer opening OP2*a* exposing the auxiliary electrode AUE. The via layer opening OP2*a* may expose not only the auxiliary electrode AUE but also the interlayer insulating layer ILD around the auxiliary electrodes AUE in the third direction DR3.

The via insulating layer VIA may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The intermediate conductive layer AUEb of the auxiliary electrode AUE exposed by the via layer opening OP2*a* of the via insulating layer VIA may be made of aluminum (Al) as described above. Since aluminum (Al) is readily oxidized in case that it comes into contact with external air, in case that the side surfaces of the intermediate conductive layer AUEb are exposed to the outside, aluminum oxide (AlOx) may be formed around the side surfaces of the intermediate conductive layer AUEb. However, since aluminum oxide (AlOx) interferes with the contact between the auxiliary electrode AUE and a common electrode CE, it is necessary to place an anti-oxidation layer that covers the side surfaces of the intermediate conductive layer AUEb made of aluminum (Al).

The display device 1 according to an embodiment may include a capping layer CCE disposed on the auxiliary electrode AUE. The capping layer CCE may include a first capping layer CCE1 covering the entire side surfaces of the intermediate conductive layer AUEb of the auxiliary electrode AUE and a second capping layer CCE2 separated from the first capping layer CCE1 and disposed on the upper conductive layer AUEc of the auxiliary electrode AUE.

The first capping layer CCE1 of the capping layer CCE may prevent oxidation of the intermediate conductive layer AUEb by preventing the side surfaces of the intermediate conductive layer AUEb of the auxiliary electrode AUE from being exposed to the outside.

The first capping layer CCE1 may become thinner as the first capping layer CCE1 is closer to the upper conductive layer AUEc due to the undercut structure in which the side surfaces of the intermediate conductive layer AUEb of the auxiliary electrode AUE are disposed inside the side surfaces of the upper conductive layer AUEc on the intermediate conductive layer AUEb. This will be described in detail below.

The second capping layer CCE2 of the capping layer CCE may be a portion of the capping layer CCE which is cut off due to the above-described undercut structure of the auxiliary electrode AUE.

The first capping layer CCE1 covering (e.g., completely covering) the side surfaces of the intermediate conductive layer AUEb of the auxiliary electrode AUE may contact (e.g., directly contact) the common electrode CE. For example, since the auxiliary electrode AUE is electrically connected to the common electrode CE, the first capping layer CCE1 needs to have conductivity. Accordingly, the capping layer CCE may include a material that is resistant to oxidation and has conductivity.

In some embodiments, the capping layer CCE may include titanium (Ti), molybdenum (Mo), or a conductive oxide, but embodiments are not limited thereto. The conductive oxide may include, for example, indium tin oxide (ITO) or indium zinc oxide (IZO).

A pixel electrode layer PXL may be disposed on the via insulating layer VIA. The pixel electrode layer PXL may include a pixel electrode PXE. A single pixel electrode PXE may be disposed in each pixel PX. The pixel electrode PXE may be electrically connected to the drain electrode DE of the thin-film transistor TR through a contact hole (or via hole) penetrating the via insulating layer VIA. The pixel electrode PXE may function as an anode of a light emitting element.

In some embodiments, the pixel electrode layer PXL may have a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are stacked, but embodiments are not limited thereto. For example, the material layer having a high work function may be disposed on the reflective material layer so that it is positioned close to an intermediate layer EML to be described below. In some embodiments, the pixel electrode layer PXL may have a multilayer structure of ITO/Mg, ITO/MgF, ITO/Ag, or ITO/Ag/ITO, but embodiments are not limited thereto.

The pixel electrode layer PXL may further include a first dummy pixel electrode PXDE1 and a second dummy pixel electrode PXDE2. Although the first dummy pixel electrode PXDE1 and the second dummy pixel electrode PXDE2 are electrically and physically separated from the pixel electrode PXE, they may be disposed on the same layer and have the same stacked structure as the pixel electrode PXE.

The first dummy pixel electrode PXDE1 may extend from the upper surface of the via insulating layer VIA to an upper surface of the interlayer insulating layer ILD and an upper surface of the capping layer CCE exposed by the via layer opening OP2a.

The first dummy pixel electrode PXDE1 may be patterned to be separated and spaced apart from the pixel electrode PXE on the upper surface of the via insulating layer VIA. The second dummy pixel electrode PXDE2 may be disposed on an upper surface of the upper conductive layer AUEc of the auxiliary electrode AUE. The second dummy pixel electrode PXDE2 may be adjacent to or overlap the first dummy pixel electrode PXDE1 in plan view, but may be separated from the first dummy pixel electrode PXDE1 in the third direction DR3 which is the thickness direction.

The first dummy pixel electrode PXDE1 and the second dummy pixel electrode PXDE2 may be electrically connected through the auxiliary electrode AUE. However, since the pixel electrode PXE is electrically isolated from the first dummy pixel electrode PXDE1 as described above, it may operate independently without being short-circuited by the neighboring first and second dummy pixel electrodes PXDE1 and PXDE2.

A pixel defining layer PDL may be disposed on the pixel electrode layer PXL. The pixel defining layer PDL may define emission areas. The pixel defining layer PDL may include a first opening OP1 at least partially exposing the pixel electrode PXE. For example, the pixel defining layer PDL may further include a second opening OP2b exposing the auxiliary electrode AUE and the via insulating layer VIA around the auxiliary electrode AUE.

The pixel defining layer PDL may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB). The pixel defining layer PDL may also include an inorganic material. For example, the pixel defining layer PDL may include a stacked layer of an inorganic layer and an organic layer.

The intermediate layer EML may be disposed on the pixel defining layer PDL. The intermediate layer EML may include an organic light emitting layer. The intermediate layer EML may further include a hole injection/transport layer disposed under the organic light emitting layer and/or an electron injection/transport layer disposed on the organic light emitting layer. The planar shape of the hole injection/transport layer and/or the electron injection/transport layer may be the same as the planar shape of the organic light emitting layer, but embodiments are not limited thereto. The intermediate layer EML may be in the form of a light emitting material layer.

The intermediate layer EML may cover the entire display area DA of the display panel PNL in plan view. For example, the intermediate layer EML may include a light emitting portion EL covering the first opening OP1 formed by the pixel defining layer PDL and extending to a portion where the first dummy pixel electrode PXDE1 is disposed and a dummy portion EDL disposed on the second dummy pixel electrode PXDE2.

The light emitting portion EL of the intermediate layer EML may have a portion in contact with an upper surface of the pixel electrode PXE exposed in the first opening OP1 of the pixel defining layer PDL and thus may emit light. The light emitting portion EL may extend onto an upper surface of the pixel defining layer PDL beyond the first opening OP1 and may cover the first dummy pixel electrode PXDE1.

The dummy portion EDL of the intermediate layer EML may be disposed on an upper surface of the auxiliary electrode AUE and thus separated from the light emitting portion EL. Accordingly, since the light emitting portion EL is electrically connected to the pixel electrode PXE of a single pixel PX, unwanted light emission of an adjacent pixel PX may be prevented.

A common electrode layer CEL may be disposed on the intermediate layer EML. In some embodiments, the common electrode layer CEL may include a material layer having a small work function such as Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg), but embodiments are not limited thereto. The common electrode layer CEL may further include a transparent metal oxide layer disposed on the material layer having a small work function.

The common electrode layer CEL may cover the intermediate layer EML. For example, the common electrode layer CEL may cover the entire display area DA of the display panel PNL in plan view. The common electrode layer CEL may include the common electrode CE in contact with the light emitting portion EL of the intermediate layer EML, a portion of which is disposed in the first opening OP1 formed by the pixel defining layer PDL, and a dummy common electrode CDE separated from the common electrode CE and disposed on the dummy portion EDL of the intermediate layer EML.

In a portion adjacent to the auxiliary electrode AUE, the common electrode CE may cover the first dummy pixel electrode PXDE1 and the light emitting portion EL on the first capping layer CCE1 to partially contact the first capping layer CCE1 covering the side surfaces of the intermediate conductive layer AUEb of the auxiliary electrode AUE. Accordingly, the whole of the common electrode CE may be electrically connected via the auxiliary electrode AUE. The auxiliary electrode AUE made of the data conductive layer DSL may include a material having lower resistance than that of the common electrode CE. Since the auxiliary electrode AUE including a material having a relatively low resistance is electrically connected to the common electrode CE, a voltage drop phenomenon of the common electrode CE may be reduced.

For example, since the first capping layer CCE1 covering the side surfaces of the intermediate conductive layer AUEb of the auxiliary electrode AUE prevents oxidation of the side surfaces of the intermediate conductive layer AUEb, the contact between the common electrode CE and the auxiliary electrode AUE may be improved.

The structure of the auxiliary electrode AUE and the capping layer CCE disposed around the auxiliary electrode AUE will now be described in detail.

Figure 7:
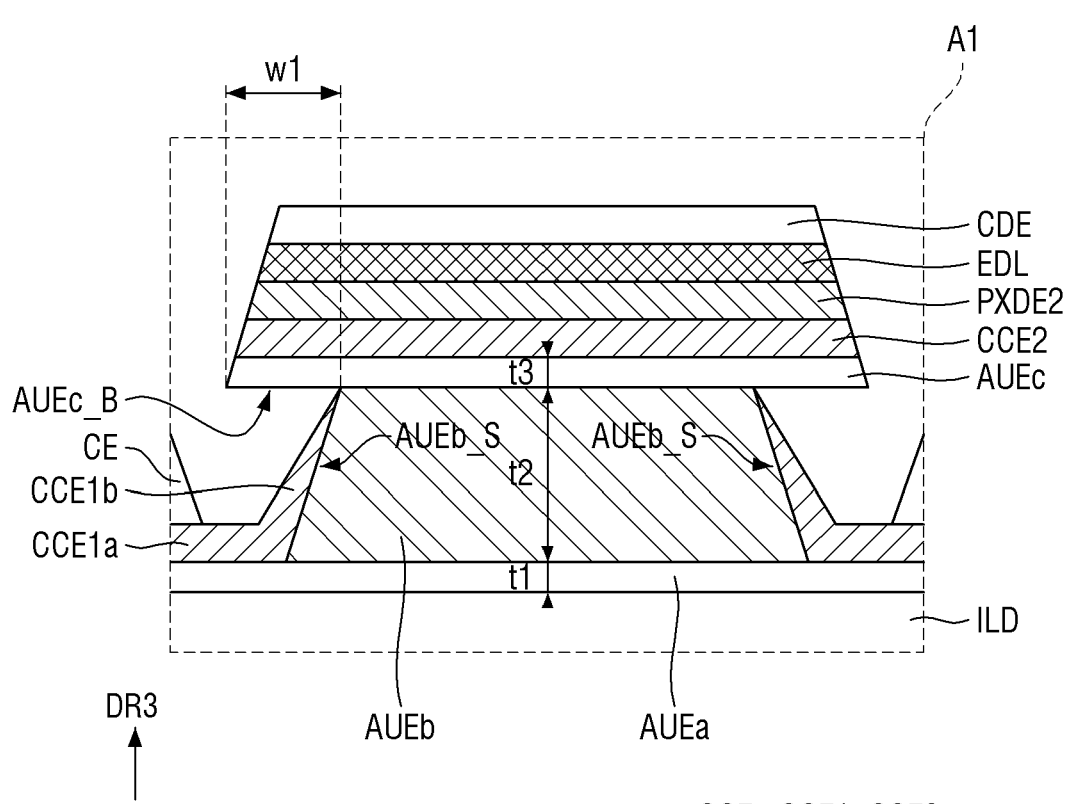
FIG. 7 is a schematic enlarged view of area A1 of FIG. 6.

FIG. 7 is a schematic enlarged view of area A1 of FIG. 6.

Referring to FIG. 7, the auxiliary electrode AUE may include the lower conductive layer AUEa disposed on the interlayer insulating layer ILD, the intermediate conductive layer AUEb disposed on the lower conductive layer AUEa, and the upper conductive layer AUEc disposed on the intermediate conductive layer AUEb as described above.

A lower surface of the intermediate conductive layer AUEb may contact (e.g., directly contact) an upper surface of the lower conductive layer AUEa, and an upper surface of the intermediate conductive layer AUEb may contact (e.g., directly contact) a lower surface of the upper conductive layer AUEc.

The lower conductive layer AUEa may include at least one of titanium (Ti), molybdenum (Mo), and a conductive oxide to a thickness t1 of about 500 Å. The intermediate conductive layer AUEb may include at least one of aluminum (Al) and copper (Cu) to a thickness t2 of about 6000 Å. The upper conductive layer AUEc may include at least one of titanium (Ti), molybdenum (Mo), and a conductive oxide to a thickness t3 of about 500 Å.

The auxiliary electrode AUE may have an undercut structure in which side surfaces AUEb_S of the intermediate conductive layer AUEb are disposed inside the side surfaces of the lower conductive layer AUEa and the upper conductive layer AUEc. For example, as illustrated in FIG. 7, the width of the intermediate conductive layer AUEb of the auxiliary electrode AUE may be smaller than the widths of the lower conductive layer AUEa and the upper conductive layer AUEc in a cross section. For example, the upper conductive layer AUEc may protrude from each side surface of the intermediate conductive layer AUEb by a first width w1. Accordingly, elements disposed on the auxiliary electrode AUE may be separated.

In some embodiments, the first width w1 may be in the range of about 0.1 μm to about 1 μm, but embodiments are not limited thereto. In case that the first width w1 exceeds about 1 μm, the first capping layer CCE1 formed in a process of manufacturing a display device which will be described below may not completely cover the side surfaces AUEb_S of the intermediate conductive layer AUEb. In case that the first width w1 is less than about 0.1 μm, element layers disposed on the auxiliary electrode AUE, for example, the pixel electrode layer PXL, the intermediate layer EML and the common electrode layer CEL may not be separated. For example, neighboring pixels PX may share the pixel electrode layer PXL, the intermediate layer EML, and the common electrode layer CEL. Consequently, the pixels PX may malfunction. For descriptive convenience, a case where the first width w1 is about 1 μm will be described below.

Since the upper conductive layer AUEc protrudes from the intermediate conductive layer AUEb by the first width w1, a portion of the bottom surface of the upper conductive layer AUEc may be exposed from the intermediate conductive layer AUEb as an exposed surface AUEc_B.

The capping layer CCE may include the first capping layer CCE1 covering the side surfaces AUEb_S of the intermediate conductive layer AUEb of the auxiliary electrode AUE and the second capping layer CCE2 disposed on the upper surface of the upper conductive layer AUEc of the auxiliary electrode AUE.

The first capping layer CCE1 may include a first portion CCE1a disposed on the upper surface of the lower conductive layer AUEa of the auxiliary electrode AUE and a second portion CCE1b covering the side surfaces AUEb_S of the intermediate conductive layer AUEb.

The first portion CCE1a may be disposed on the upper surface of the lower conductive layer AUEa to have a substantially constant thickness. In some embodiments, the common electrode CE may contact (e.g., directly contact) the first portion CCE1a. However, embodiments are not limited thereto. For example, the common electrode CE may also contact (e.g., directly contact) the second portion CCE1b.

The second portion CCE1b may be disposed along the side surfaces AUEb_S of the intermediate conductive layer AUEb to become thinner as the second portion CCE1b is closer to the upper conductive layer AUEc. In some embodiments, the second portion CCE1b may cover (e.g., completely cover) the side surfaces AUEb_S of the intermediate conductive layer AUEb. However, embodiments are not limited thereto. For example, the second portion CCE1b may also cover only a portion of the side surfaces AUEb_S of the intermediate conductive layer AUEb. For descriptive convenience, a case where the second portion CCE1b completely covers the side surfaces AUEb_S of the intermediate conductive layer AUEb will be described below.

In some embodiments, the second portion CCE1b may not cover the exposed surface AUEc_B of the upper conductive layer AUEc of the auxiliary electrode AUE. However, embodiments are not limited thereto. In case that the second portion CCE1b does not cover the exposed surface AUEc_B of the upper conductive layer AUEc of the auxiliary electrode AUE, the second portion CCE1b may cover a boundary between the side surfaces AUEb_S of the intermediate conductive layer AUEb and the exposed surface AUEc_B of the upper conductive layer AUEc. This may be because the capping layer CCE is formed by a sputtering process in a method of manufacturing a display device which will be described below.

The first capping layer CCE1 may include a material that is resistant to oxidation and has conductivity. In some embodiments, the capping layer CCE may include titanium (Ti), molybdenum (Mo), or a conductive oxide, but embodiments are not limited thereto. The conductive oxide may include, for example, indium tin oxide (ITO) or indium zinc oxide (IZO).

By including a material resistant to oxidation, the first capping layer CCE1 may cover (e.g., completely cover) the side surfaces AUEb_S of the intermediate conductive layer AUEb to prevent oxidation of the side surfaces AUEb_S of the intermediate conductive layer AUEb. For example, by including a conductive material, the first capping layer CCE1 may contact (e.g., directly contact) the common electrode CE to ensure the connectivity of the common electrode CE. For example, by including a material that is resistant to oxidation and has conductivity, the first capping layer CCE1 may not be oxidized, and thus an oxide layer may not be formed outside the first capping layer CCE1. Accordingly, the contact between the first capping layer CCE1 and the common electrode CE may be improved.

The second capping layer CCE2 may be disposed on the upper surface of the upper conductive layer AUEc of the auxiliary electrode AUE. The second dummy pixel electrode PXDE2 of the pixel electrode layer PXL, the dummy portion EDL of the intermediate layer EML, and the dummy common electrode CDE of the common electrode layer CEL may be sequentially disposed on the second capping layer CCE2 along the first side in the third direction DR3.

A method of manufacturing the display device 1 according to an embodiment will be described below.

FIGS. 8 through 11 are schematic cross-sectional views illustrating steps of a method of manufacturing a display device according to an embodiment. FIGS. 8 through 11 illustrate a process of forming a capping layer CCE of the display device 1 according to an embodiment.

Figure 8:
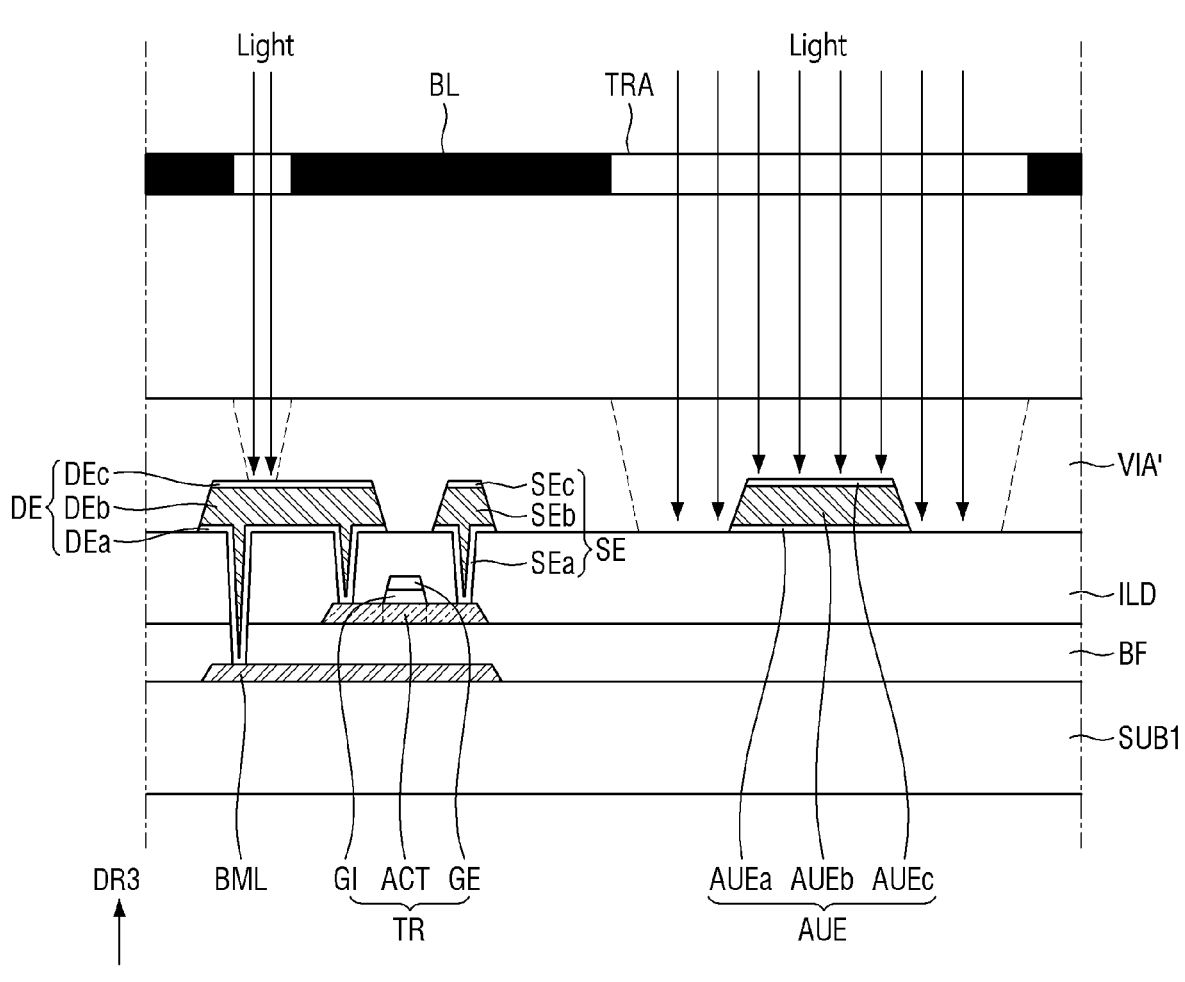
FIGS. 8 through 11 are cross-sectional views illustrating steps of a method of manufacturing a display device according to an embodiment.

Referring to FIGS. 8 and 6, a first substrate SUB1 on which a data conductive layer DSL including a source electrode SE, a drain electrode DE and an auxiliary electrode AUE is formed on an interlayer insulating layer ILD is prepared. An organic material layer VIA' may be formed by applying an organic material for a via insulating layer onto the data conductive layer DSL. For example, the organic material layer VIA' may be exposed to light by using a photomask MASK.

A method of forming the first substrate SUB1 on which the data conductive layer DSL including the source electrode SE, the drain electrode DE and the auxiliary electrode AUE is formed on the interlayer insulating layer ILD is as follows. A bottom metal layer BML may be formed on the first substrate SUB1, and a buffer layer BF may be formed on the bottom metal layer BML. For example, a semiconductor layer ACT may be formed on the buffer layer BF, and a gate insulating layer GI and a gate conductive layer may be formed on the semiconductor layer ACT. For example, the gate conductive layer may be patterned to form a gate electrode GE, and the gate insulating layer GI may be patterned by using the gate electrode GE as an etch mask. For example, the interlayer insulating layer ILD may be stacked, and contact holes respectively exposing the bottom metal layer BML, a first region of the semiconductor layer ACT and a second region of the semiconductor layer ACT may be formed. For example, a first sub-conductive layer including titanium, a main conductive layer including aluminum, and a second sub-conductive layer including titanium may be sequentially stacked and then patterned to form the source electrode SE, the drain electrode DE and the auxiliary electrode AUE as illustrated in FIG. 8. Side surfaces of the patterned source electrode SE, drain electrode DE and auxiliary electrode AUE may have an acute angle of inclination, but embodiments are not limited thereto.

The organic material layer VIA' disposed on the data conductive layer DSL may include a positive photosensitive material. In a method of exposing the organic material layer VIA' to light by using the photomask MASK, for example, the organic material layer VIA' may be dried and baked and then may be exposed to light by using the photomask MASK including alight transmitting area TRA and alight blocking area BL. For example, the light transmitting area TRA may be disposed to correspond to a via layer opening OP2a and a contact hole formation area exposing the drain electrode DE.

Figure 9:
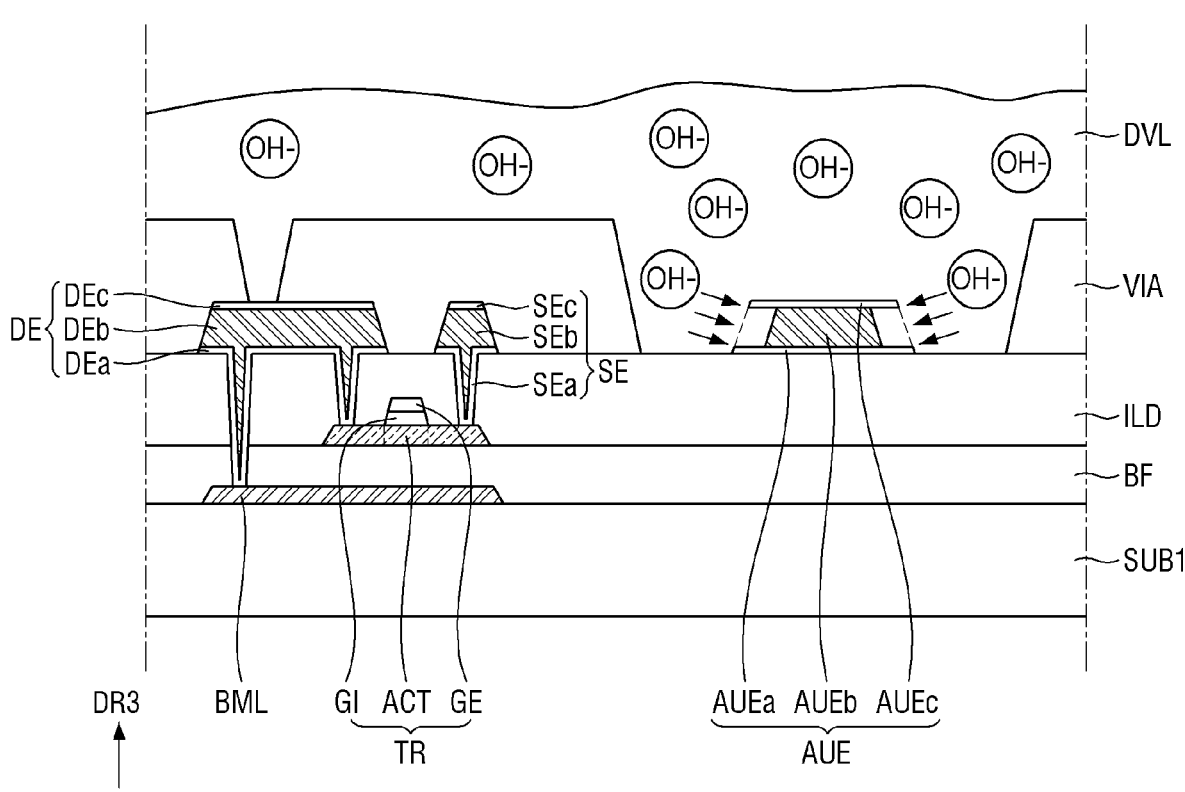

Referring to FIGS. 9 and 6, a developer process for applying a developer DVL may be performed. The developer DVL may include a tetramethylammonium hydroxide (TMAH) solution. The concentration of TMAH in the developer DVL may be in the range of about 0.04% to about 5%, but embodiments are not limited thereto. An exposed portion of the organic material layer VIA' is removed by the developer DVL.

The developer process time may include not only a first process time for removing (e.g., completely removing) the exposed portion of the organic material layer VIA', but also a second process time for forming an undercut structure of the auxiliary electrode AUE. For example, in case that the time required to remove (e.g., completely remove) the exposed portion by using the developer DVL is about 60 seconds, the developer process may be performed for a time of (60 seconds+α).

After the first process time elapses, the exposed portion of the organic material layer VIA' may be removed to form a via insulating layer VIA, and upper and side surfaces of the auxiliary electrode AUE may be exposed to the developer DVL. The developer DVL including the TMAH solution contains hydroxide ions (OH—). Hydroxide ions may have a property of etching a metal material. In the auxiliary electrode AUE, in case that an etching rate of an intermediate conductive layer (or first conductive layer) AUEb for hydroxide ions is greater than etching rates of a lower conductive layer (or third conductive layer) AUEa and an upper conductive layer (or second conductive layer) AUEc, the intermediate conductive layer AUEb may be etched (e.g., primary etched), the auxiliary electrode AUE may have an undercut shape in which side surfaces of the intermediate conductive layer AUEb are recessed inward from side surfaces of the upper conductive layer AUEc. Since aluminum has a much higher etching rate for hydroxide ions than titanium, in case that the intermediate conductive layer AUEb includes aluminum and the lower conductive layer AUEa and the upper conductive layer AUEc include titanium as described above, only the intermediate conductive layer AUEb may be etched.

Figure 10:
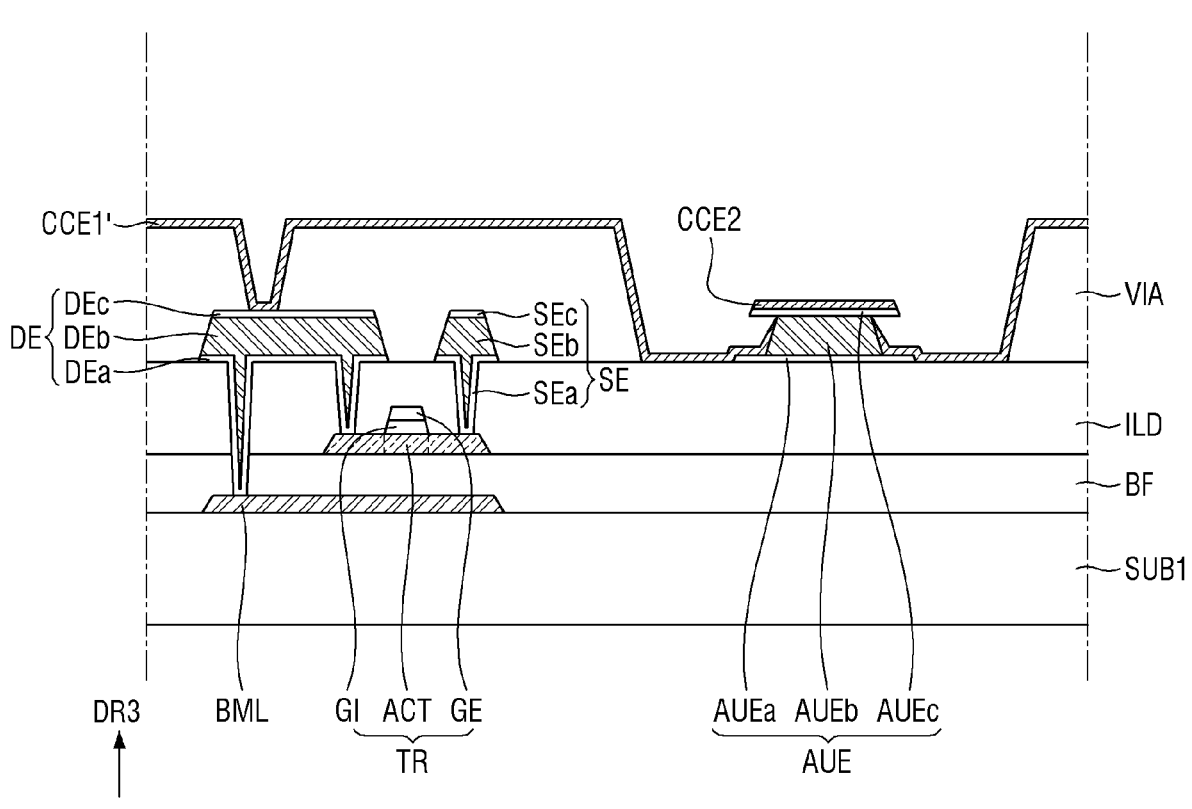

Referring to FIGS. 10 and 6, a capping material layer CCE' may be stacked on the via insulating layer VIA. The capping material layer CCE' may be formed by a sputtering process or a chemical vapor deposition (CVD) process.

The capping material layer CCE' may be deposited to cover the entire surface of the structure on the first substrate SUB1 described above with reference to FIGS. 8 and 9.

However, since the auxiliary electrode AUE has the under-
cut structure described above, it may have poor step cover-
age. Therefore, the capping material layer CCE' deposited
on the upper surface of the auxiliary electrode AUE and the
capping material layer CCE' deposited around the auxiliary
electrode AUE may be spaced apart and separated from each
other in the third direction DR3. For example, the capping
material layer CCE' deposited around the auxiliary electrode
AUE may be a first capping material layer CCE1', and the
capping material layer CCE' deposited on the upper surface
of the auxiliary electrode AUE may be a second capping
layer CCE2.

The first capping material layer CCE1' may be deposited
to become thinner in the third direction DR3 in a portion in
contact with the side surfaces of the intermediate conductive
layer AUEb of the auxiliary electrode AUE. For example,
the first capping material layer CCE1' may be deposited with
poor step coverage because the auxiliary electrode AUE has
the undercut structure described above.

Figure 11:
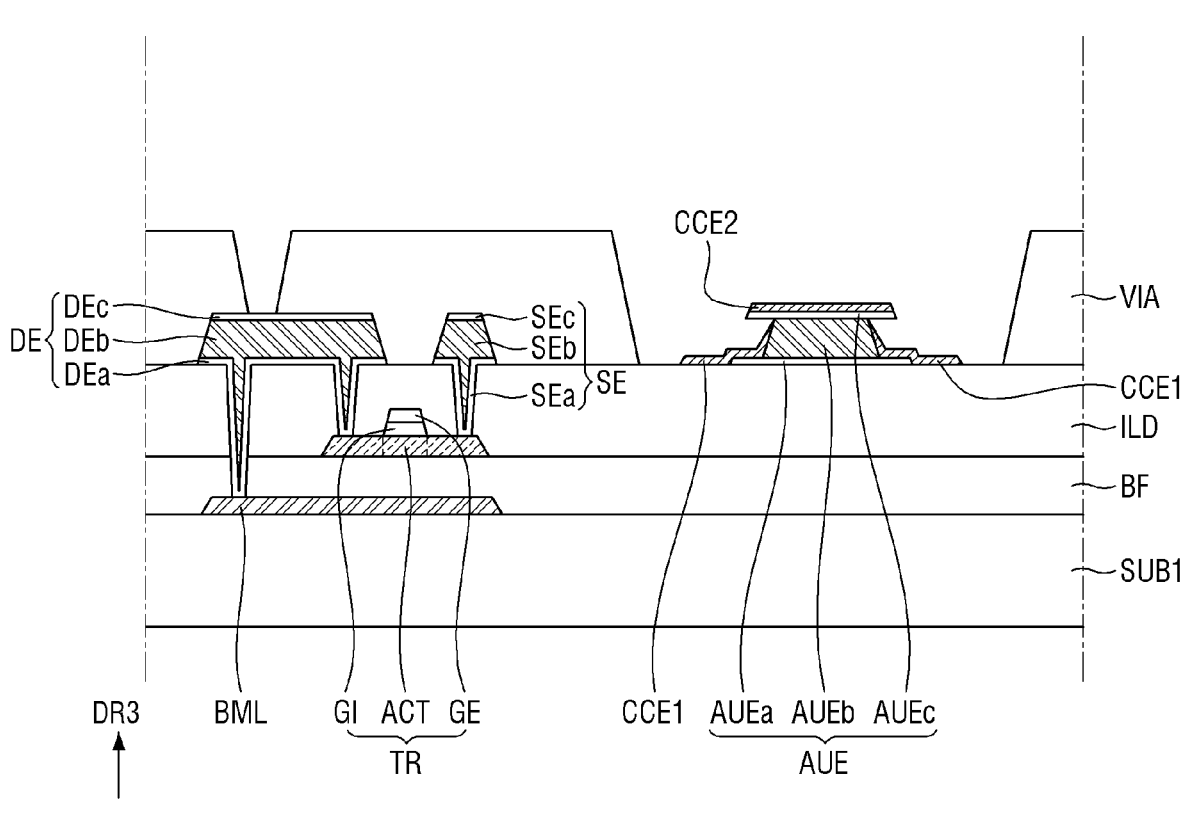

Referring to FIGS. 11 and 6, the first capping material
layer CCE1' is etched to form a first capping layer CCE1. In
the process of forming the first capping layer CCE1 by
etching the first capping material layer CCE1', a photoresist
pattern may be formed as an etch stop layer on portions other
than a portion to be etched, and dry etching may be
performed on the portion to be etched.

For example, the display device 1 according to an
embodiment may be implemented as illustrated in FIG. 6 by
sequentially forming a pixel electrode layer PXL, a pixel
defining layer PDL, an intermediate layer EML, and a
common electrode layer CEL.

According to the manufacturing method described above,
since the side surfaces of the intermediate conductive layer
AUEb of the auxiliary electrode AUE are covered by the first
capping layer CCE1 before the pixel electrode layer PXL,
the pixel defining layer PDL, intermediate layer EML and
the common electrode layer CEL are formed, the side
surfaces of the intermediate conductive layer AUEb may not
be oxidized.

Hereinafter, other embodiments of the display device 1
will be described. In the following embodiments, the same
elements as those of the above-described embodiment will
be indicated by the same reference numerals, and their
redundant description will be omitted or given briefly, and
differences will be described for descriptive convenience.

Figure 12:
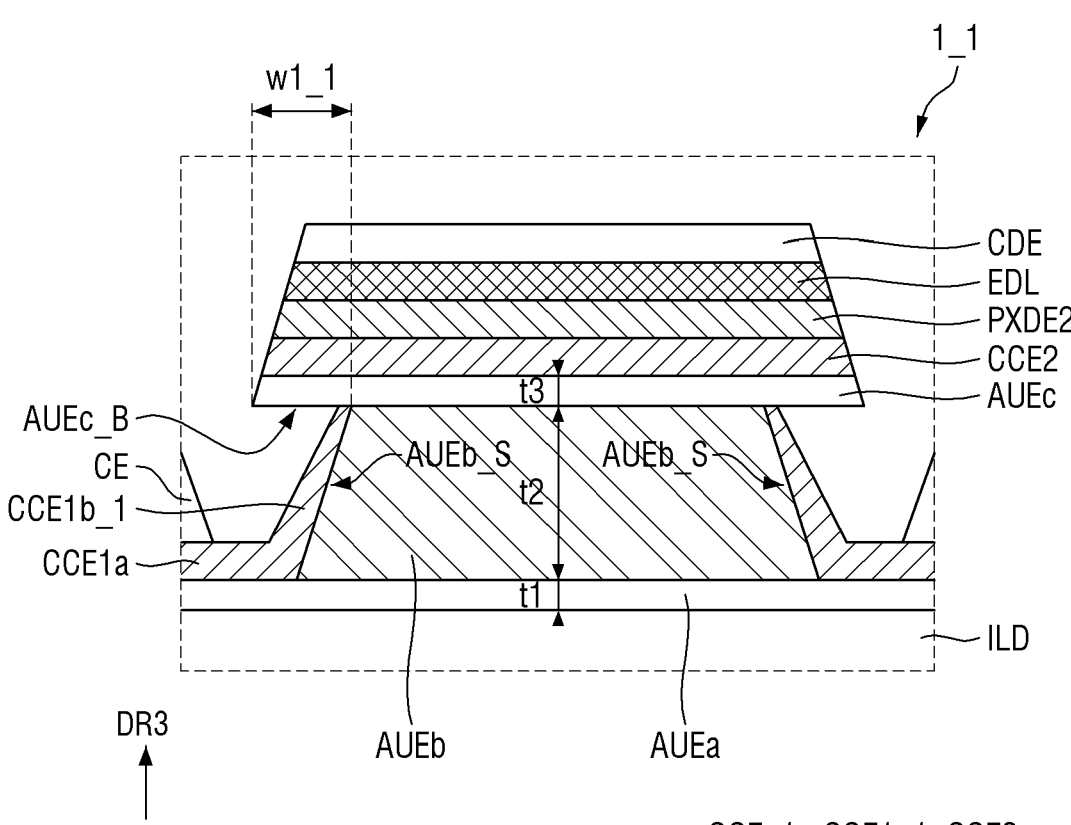
FIG. 12 is a schematic cross-sectional view illustrating the structure of an auxiliary electrode of a display device according to an embodiment.

FIG. 12 is a schematic cross-sectional view illustrating
the structure of an auxiliary electrode AUE of a display
device 1_1 according to an embodiment.

Referring to FIG. 12, the display device 1_1 may be an
example that a capping layer CCE_1 may be thickly formed
to partially cover an exposed surface AUEc_B of an upper
conductive layer (or second conductive layer) AUEc of the
auxiliary electrode AUE. This may result from the formation
of the capping layer CCE_1 under different process condi-
tions.

The capping layer CCE_1 may include a first capping
layer CCE1_1 and a second capping layer CCE2. The first
capping layer CCE1_1 may include a first portion CCE1a
covering a lower conductive layer (or third conductive layer)
AUEa of the auxiliary electrode AUE and a second portion
CCE1b_1 covering side surfaces AUEb_S of an intermedi-
ate conductive layer (or first conductive layer) AUEb of the
auxiliary electrode AUE. The second portion CCE1b_1 may
partially cover the exposed surface AUEc_B of the upper
conductive layer AUEc. Accordingly, the exposed surface
AUEc_B of the upper conductive layer AUEc may be
exposed as much as a second width w1_1 which is smaller than a first width w1 (see FIG. 7), e.g., a width of the
exposed surface AUEc_B itself. This may result from, for
example, a relatively long process time spent to form the
capping layer CCE_1.

Figure 13:
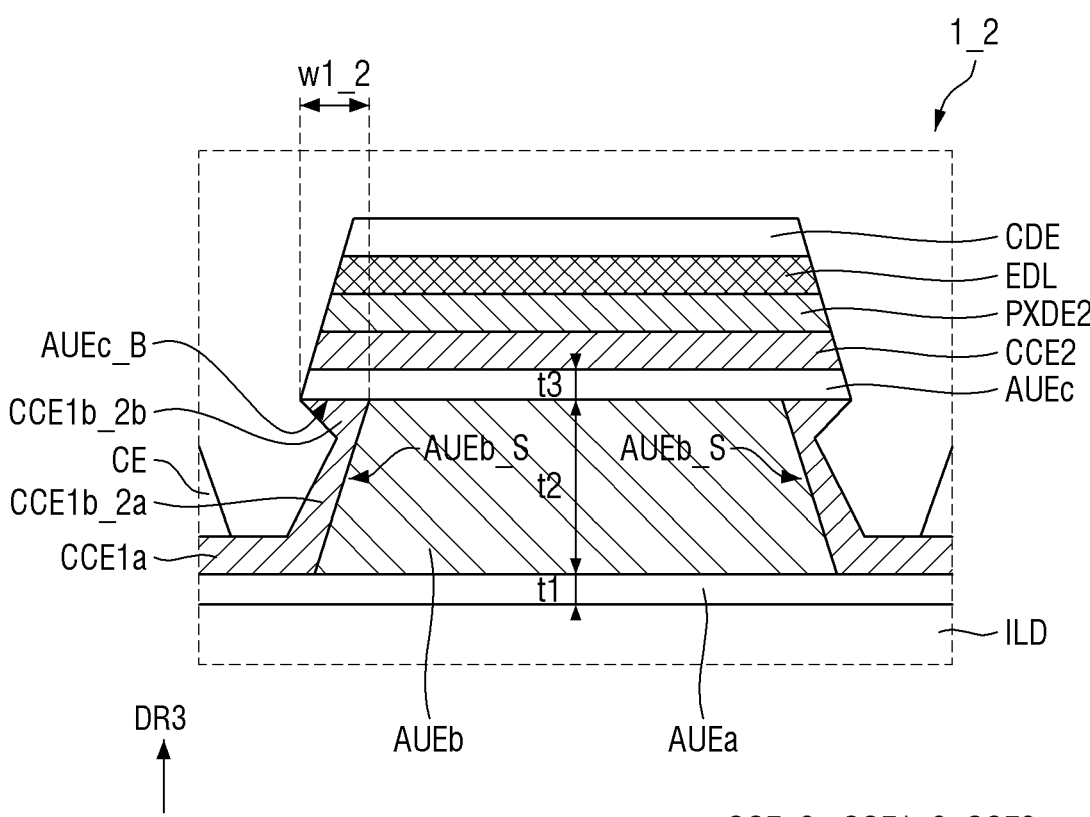
FIG. 13 is a schematic cross-sectional view illustrating the structure of an auxiliary electrode of a display device according to an embodiment.

FIG. 13 is a schematic cross-sectional view illustrating
the structure of an auxiliary electrode AUE of a display
device 1_2 according to an embodiment.

Referring to FIG. 13, the display device 1_2 may be an
example that a capping layer CCE_2 may cover (e.g.,
completely cover) an exposed surface AUEc_B of an upper
conductive layer (or second conductive layer) AUEc of the
auxiliary electrode AUE. The display device 1_2 may be
formed by the formation of the capping layer CCE_2 under
different process conditions.

The exposed surface AUEc_B of the upper conductive
layer AUEc of the display device 1_2 may have a third width
w1_2. For example, the third width w1_2 may be about 0.1
μm which is smaller than the first width w1 of the exposed
surface AUEc_B of the upper conductive layer AUEc of the
display device 1 according to the embodiment of FIG. 7.
Therefore, the capping layer CCE_2 may cover (e.g., com-
pletely cover) the exposed surface AUEc_B of the upper
conductive layer AUEc.

The capping layer CCE_2 may include a first capping
layer CCE1_2 and a second capping layer CCE2. The first
capping layer CCE1_2 may include a first portion CCE1a
covering a lower conductive layer (or third conductive layer)
AUEa of the auxiliary electrode AUE and a second portion
CCE1b_2 covering side surfaces AUEb_S of an intermedi-
ate conductive layer (or first conductive layer) AUEb of the
auxiliary electrode AUE.

The second portion CCE1b_2 may include a first inclined
portion CCE1b_2a having a decreasing thickness along the
first side in the third direction DR3 and a second inclined
portion CCE1b_2b having an increased thickness along the
first side in the third direction DR3. Since the thickness of
the second portion CCE1b_2 increases in the second
inclined portion CCE1b_2b, the second portion CCE1b_2
may cover (e.g., completely cover) the exposed surface
AUEc_B of the upper conductive layer AUEc having the
third width w_2 smaller than the first width w1.

Figure 14:
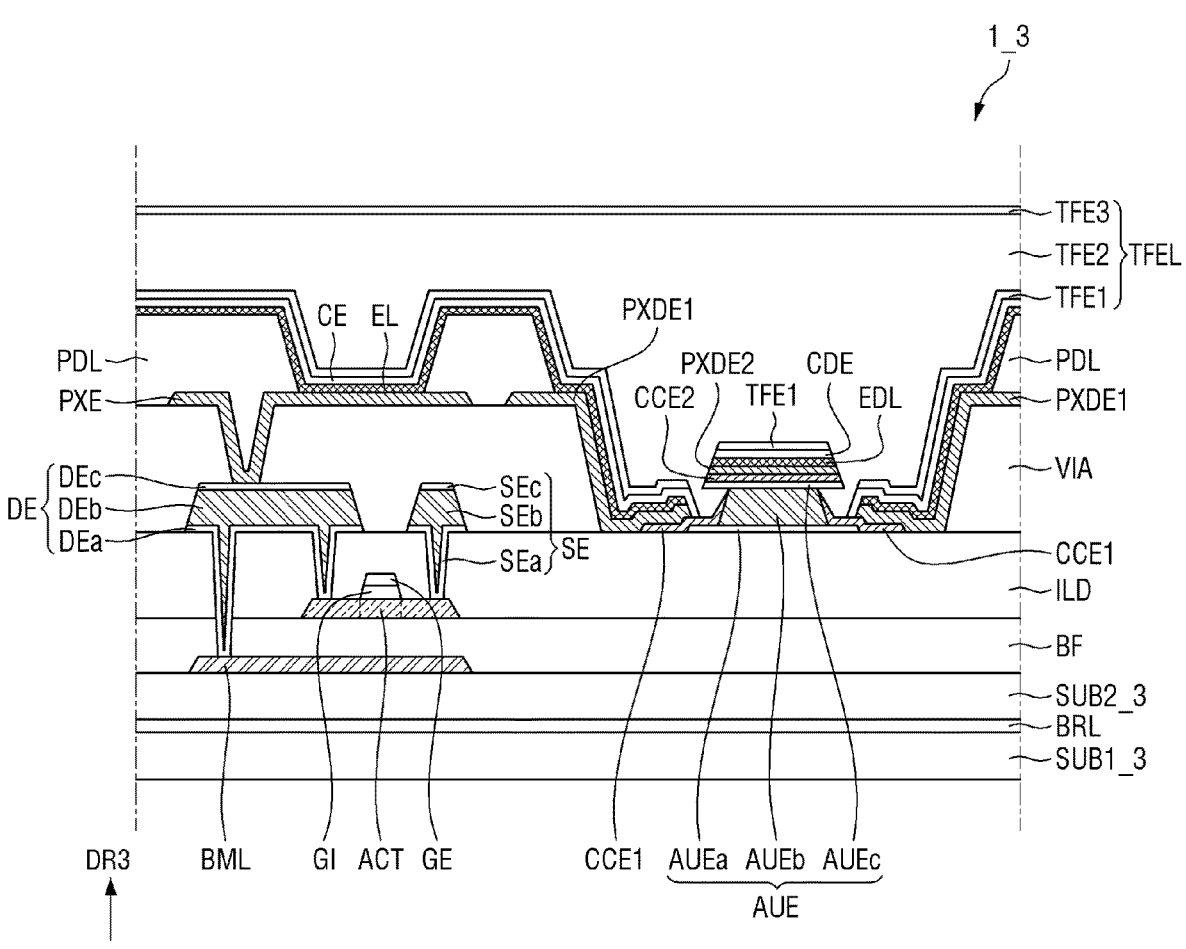
FIG. 14 is a schematic cross-sectional view illustrating the pixel structure of a display device according to an embodiment.

FIG. 14 is a schematic cross-sectional view illustrating
the pixel structure of a display device 1_3 according to an
embodiment.

Referring to FIG. 14, the display device 1_3 may be an
example that a display panel PNL may be a flexible display
panel. For example, the display device 1_3 is different from
the display device 1 according to the embodiment of FIG. 6
in the configuration of a substrate SUB_3 and in that it
further includes a thin-film encapsulation layer TFEL dis-
posed on a common electrode layer CEL. Other elements of
the display device 1_3 are substantially the same as or
similar to those of the display device 1 according to the
embodiment of FIG. 6.

Referring to FIG. 14, the substrate SUB_3 may be curved,
bent, folded, rolled, or stretched. The substrate SUB_3 may
be made of, for example, an insulating material such as a
polymer resin. The polymer material may be, for example,
polyethersulphone (PES), polyacrylate (PA), polyarylate
(PAR), polyetherimide (PEI), polyethylene naphthalate
(PEN), polyethylene terepthalate (PET), polyphenylene sul-
fide (PPS), polyallylate, polyimide (PI), polycarbonate (PC),
cellulose triacetate (CAT), cellulose acetate propionate
(CAP), or a combination thereof.

The substrate SUB_3 may include a first sub-substrate
SUB1_3 and a second sub-substrate SUB2_3 having flexible
characteristics and a barrier layer BRL disposed between the first sub-substrate SUB1_3 and the second sub-substrate SUB2_3. Each of the first sub-substrate SUB1_3 and the second sub-substrate SUB2_3 may be a flexible substrate made of polyimide or the like. The barrier layer BRL may include silicon nitride, silicon oxide, or silicon oxynitride.

Since various element layers disposed on the substrate SUB_3 are substantially the same as the various element layers of the display device 1 according to an embodiment described with reference to FIG. 6, a redundant description thereof will be omitted for descriptive convenience.

The thin-film encapsulation layer TFEL may be disposed on the common electrode layer CEL. The thin-film encapsulation layer TFEL may include a first inorganic encapsulation layer TFE1, an organic encapsulation layer TFE2, and a second inorganic encapsulation layer TFE3 stacked sequentially. Each of the first inorganic encapsulation layer TFE1 and the second inorganic encapsulation layer TFE3 may include silicon nitride, silicon oxide, or silicon oxynitride. The organic encapsulation layer TFE2 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The first inorganic encapsulation layer TFE1 may be disposed on the common electrode layer CEL. The first inorganic encapsulation layer TFE1 may also be separated around the auxiliary electrode AUE by the undercut shape of the auxiliary electrode AUE.

The organic encapsulation layer TFE2 may be disposed on the first inorganic encapsulation layer TFE1. The organic encapsulation layer TFE2 may have a thick thickness to substantially remove a step difference between structures thereunder. An upper surface of the organic encapsulation layer TFE2 may be flat, but embodiments are not limited thereto. The organic encapsulation layer TFE2 may at least partially fill an empty space defined by the undercut shape of the auxiliary electrode AUE or may fill (e.g., completely fill) the empty space as illustrated in the drawing.

The second inorganic encapsulation layer TFE3 may be disposed on the organic encapsulation layer TFE2. For example, the first inorganic encapsulation layer TFE1 and the second inorganic encapsulation layer TFE3 may contact each other in a part of a non-display area NDA or a display area DA to encapsulate a space inside them.

For example, the thin-film encapsulation layer TFEL may perform the encapsulation function of the second substrate SUB2 described in FIG. 2. Since the thin-film encapsulation layer TFEL has flexible characteristics compared with a glass substrate, the display panel PNL including the thin-film encapsulation layer TFEL may have flexible characteristics.

Figure 15:
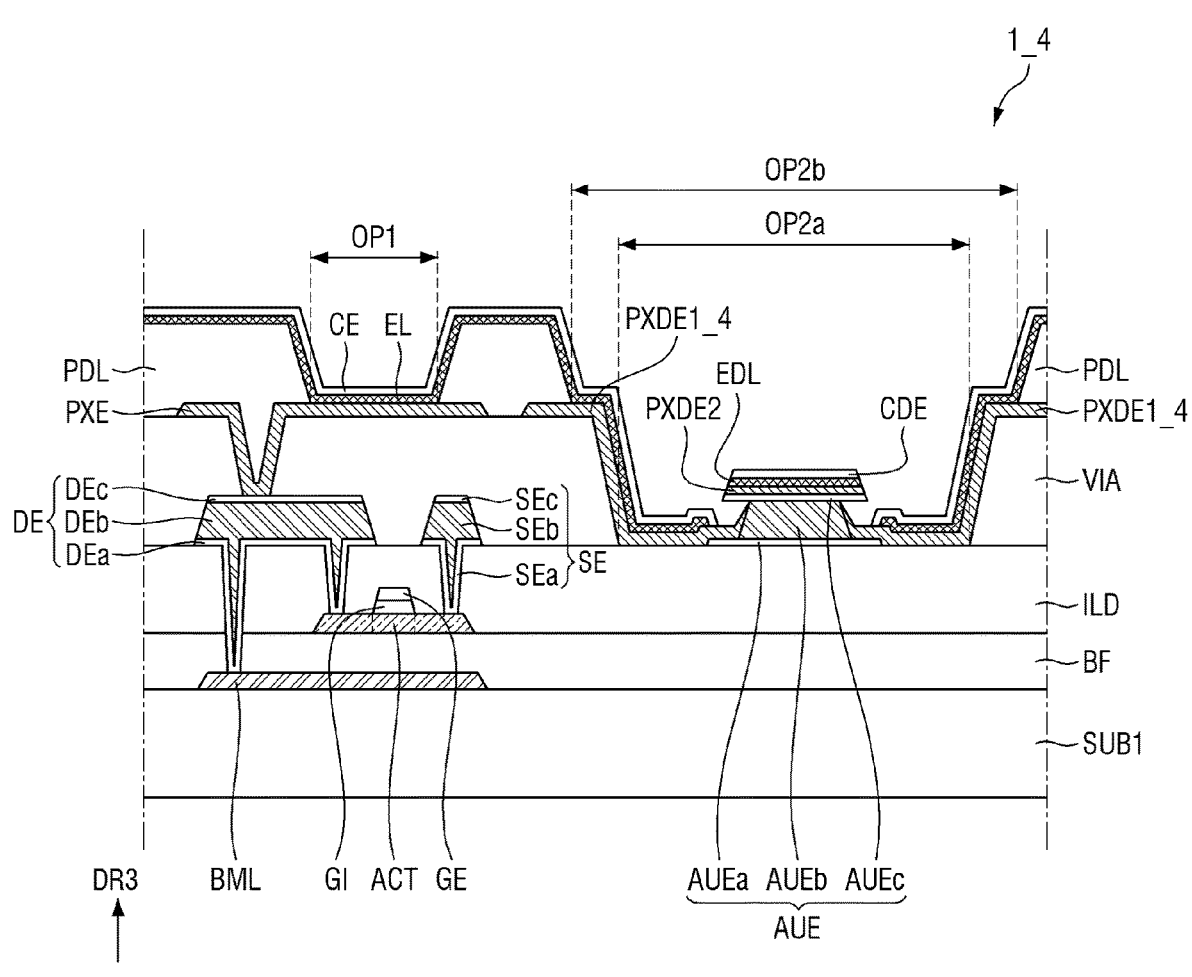
FIG. 15 is a schematic cross-sectional view illustrating the pixel structure of a display device according to an embodiment.

FIG. 15 is a schematic cross-sectional view illustrating the pixel structure of a display device 1_4 according to an embodiment.

Referring to FIG. 15, the display device 1_4 may be an example that a first dummy pixel electrode PXDE1_4 of a pixel electrode layer PXL_4 covers side surfaces of an intermediate conductive layer (or first conductive layer) AUEb of an auxiliary electrode AUE without a capping layer.

The pixel electrode layer PXL_4 may include a pixel electrode PXE, the first dummy pixel electrode PXDE1_4, and a second dummy pixel electrode PXDE2. Since the pixel electrode PXE and the second dummy pixel electrode PXDE2 are the same as those described above, a description thereof will be omitted, and the first dummy pixel electrode PXDE1_4 will be described for descriptive convenience.

The first dummy pixel electrode PXDE1_4 may extend from an upper surface of a via insulating layer VIA to an upper surface of an interlayer insulating layer ILD and the side surfaces of the intermediate conductive layer AUEb of the auxiliary electrode AUE exposed by a via layer opening OP2a to cover (e.g., completely cover) the side surfaces of the intermediate conductive layer AUEb of the auxiliary electrode AUE.

The first dummy pixel electrode PXDE1_4 may include indium tin oxide (ITO), indium zinc oxide (IZO), zinc oxide (ZnO), or indium oxide ($In_2O_3$) which is resistant to oxidation and has conductivity.

Accordingly, the first dummy pixel electrode PXDE1_4 may prevent oxidation of the intermediate conductive layer AUEb by preventing the side surfaces of the intermediate conductive layer AUEb of the auxiliary electrode AUE from being exposed to the outside.

The structure in which the first dummy pixel electrode PXDE1_4 covers the side surfaces of the intermediate conductive layer AUEb of the auxiliary electrode AUE is substantially the same as or similar to the structure in which the first capping layer CCE1 illustrated in FIG. 7, the first capping layer CCE1_1 illustrated in FIG. 12, and the first capping layer CCE1_2 illustrated in FIG. 13 cover the side surfaces of the intermediate conductive layer AUEb of the auxiliary electrode AUE. For example, the first dummy pixel electrode PXDE1_4 may be the same as (or similar to), e.g., a structure that the first capping layer CCE1 and the first dummy pixel electrode PXDE1 of FIG. 7 are integral with each other or a structure that the first capping layer CCE1 and the first dummy pixel electrode PXDE1 of FIG. 7 are formed of a same material. Thus, a detailed description thereof will be omitted for descriptive convenience.

Figure 16:
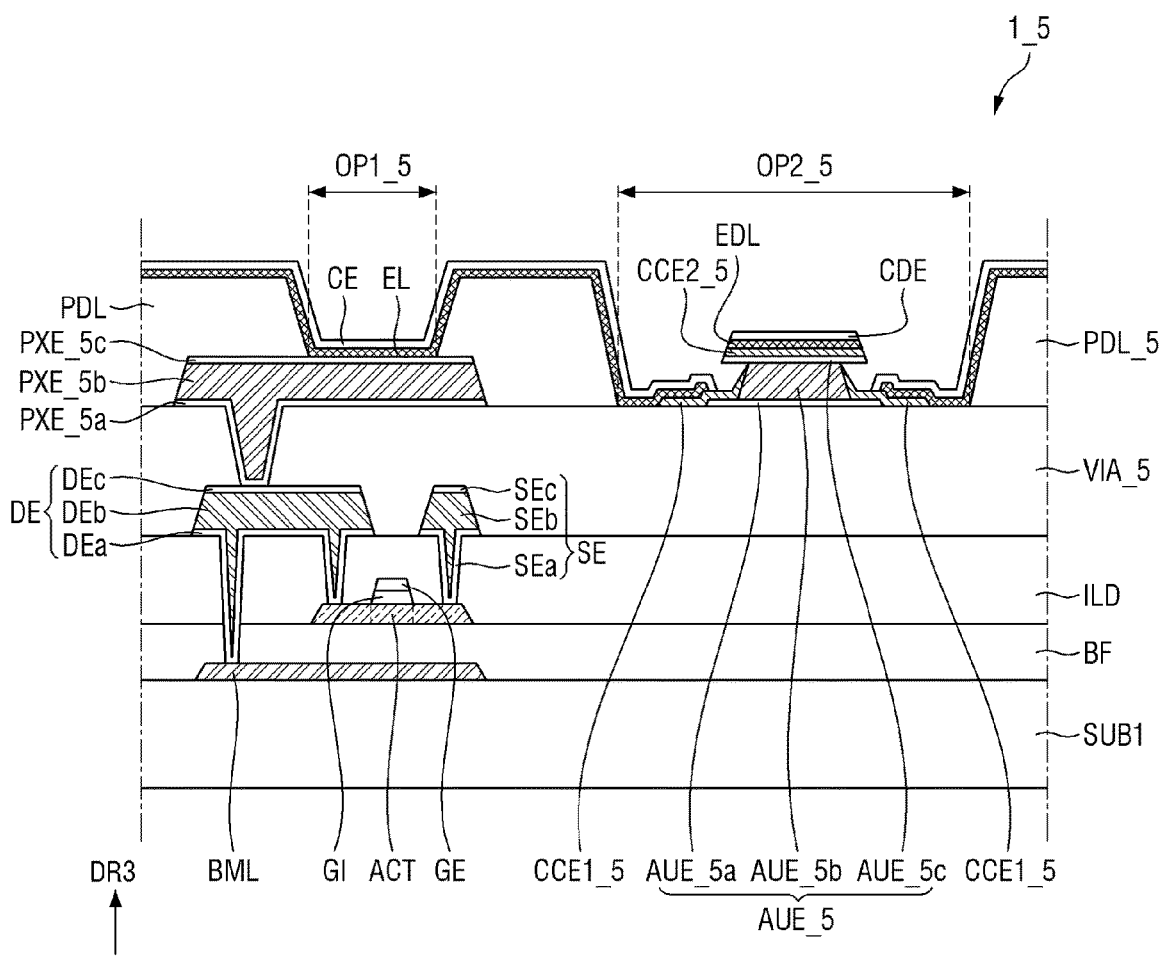
FIG. 16 is a schematic cross-sectional view illustrating the pixel structure of a display device according to an embodiment.

FIG. 16 is a schematic cross-sectional view illustrating the pixel structure of a display device 1_5 according to an embodiment.

Referring to FIG. 16, the display device 1_5 may be example that an auxiliary electrode AUE_5 is formed in a pixel electrode layer PXL_5.

The pixel electrode layer PXL_5 may include a lower conductive layer (or third conductive layer), an intermediate conductive layer (or first conductive layer), and an upper conductive layer (or second conductive layer) stacked sequentially. For example, the pixel electrode layer PXL_5 may include a lower conductive layer including a material having a high work function such as indium tin oxide (ITO), indium zinc oxide (IZO), zinc oxide (ZnO) or indium oxide ($In_2O_3$), an intermediate conductive layer including a reflective material such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof, and an upper conductive layer including a material having a high work function such as indium tin oxide (ITO), indium zinc oxide (IZO), zinc oxide (ZnO) or indium oxide ($In_2O_3$). The intermediate conductive layer may be thicker than the lower conductive layer and the upper conductive layer. For descriptive convenience, a case where the lower conductive layer includes indium tin oxide (ITO), the intermediate conductive layer includes silver (Ag), and the upper conductive layer includes indium tin oxide (ITO) will be described below.

The pixel electrode layer PXL_5 may include a pixel electrode PXE_5 electrically connected to a drain electrode DE through a contact hole penetrating a via insulating layer VIA_5 and the auxiliary electrode AUE_5 disposed on an upper surface of the pixel electrode PXE_5. Since the auxiliary electrode AUE_5 is disposed on the via insulating layer VIA_5, a via layer opening OP2a of, e.g., FIG. 6 may not be formed in the via insulating layer VIA_5 of FIG. 16, unlike in the via insulating layer VIA of the display device 1_1 according to the embodiment of FIG. 6. The pixel electrode PXE_5 and the auxiliary electrode AUE_5 may be patterns remaining after the pixel electrode layer PXL_5 is etched.

A pixel defining layer PDL_5 may be disposed on the pixel electrode layer PXL_5 and the via insulating layer VIA_5. The pixel defining layer PDL_5 may include a first opening OPL_5 exposing the pixel electrode PXE_5 and a second opening OP2_5 exposing the auxiliary electrode AUE_5. The second opening OP2_5 may further expose a portion of an upper surface of the via insulating layer VIA_5 around the auxiliary electrode AUE_5.

The pixel electrode PXE_5 may include a lower conductive layer (or third conductive layer) PXE_5a, an intermediate conductive layer (or first conductive layer) PXE_5b, and an upper conductive layer (or second conductive layer) PXE_5c stacked sequentially. Similarly, the auxiliary electrode AUE_5 may include a lower conductive layer (or third conductive layer) AUE_5a, an intermediate conductive layer (or first conductive layer) AUE_5b, and an upper conductive layer (or second conductive layer) AUE_5c stacked sequentially. For example, the pixel electrode layer PXL_5 may include the lower conductive layer PXE_5a of the pixel electrode PXE_5 and the lower conductive layer AUE_5a of the auxiliary electrode AUE_5 as a third conductive layer, may include the intermediate conductive layer PXE_5b of the pixel electrode PXE_5 and the intermediate conductive layer AUE_5b of the auxiliary electrode AUE_5 as a first conductive layer, and may include the upper conductive layer PXE_5c of the pixel electrode PXE_5 and the upper conductive layer AUE_5c of the auxiliary electrode AUE_5 as a second conductive layer.

In a cross-sectional view taken in a width direction of the pixel electrode PXE_5, side surfaces of the lower conductive layer PXE_5a, the intermediate conductive layer PXE_5b, and the upper conductive layer PXE_5c may be substantially aligned with each other. For example, in case that side surfaces of conductive layers are aligned with each other, it does not necessarily mean that widths of the conductive layers completely overlap each other in plan view. For example, in case that side surfaces of the pixel electrode PXE_5 have a substantially acute angle of inclination as illustrated in FIG. 16, the side surfaces of the lower conductive layer PXE_5a, the intermediate conductive layer PXE_5b and the upper conductive layer PXE_5c may be seen as being substantially aligned with each other even though they are disposed on a plane inclined at an acute angle.

In the auxiliary electrode AUE_5, unlike in the pixel electrode PXE_5, side surfaces of the intermediate conductive layer AUE_5b may be disposed inside side surfaces of the lower conductive layer AUE_5a and the upper conductive layer AUE_5c. For example, a width of the intermediate conductive layer AUE_5b of the auxiliary electrode AUE_5 may be smaller than widths of the lower conductive layer AUE_5a and the upper conductive layer AUE_5c in a cross section. This undercut structure in which the side surfaces of the intermediate conductive layer AUE_5b are disposed inside the side surfaces of the upper conductive layer AUE_5c on the intermediate conductive layer AUE_5b may function element layers on the auxiliary electrode AUE_5 to be separated by the auxiliary electrode AUE_5.

The intermediate conductive layer AUE_5b of the auxiliary electrode AUE_5 may be made of silver (Ag) as described above. Since silver (Ag) is readily oxidized in case that it comes into contact with external air, in case that the side surfaces of the intermediate conductive layer AUE_5b are exposed to the outside, silver oxide $(AgO_X)$ may be formed around the side surfaces of the intermediate conductive layer AUE_5b. However, since silver oxide $(AgO_X)$ interferes with the contact between the auxiliary electrode AUE_5 and a common electrode CE, it is necessary to place an anti-oxidation layer covering the side surfaces of the intermediate conductive layer AUE_5b made of silver (Ag).

The capping layer CCE_5 may include a first capping layer CCE1_5 covering the entire side surfaces of the intermediate conductive layer AUE_5b of the auxiliary electrode AUE_5 and a second capping layer CCE2_5 separated from the first capping layer CCE1_5 and disposed on the upper conductive layer AUE_5c of the auxiliary electrode AUE_5. The first capping layer CCE1_5 may prevent oxidation of the intermediate conductive layer AUE_5b by preventing the side surfaces of the intermediate conductive layer AUE_5b of the auxiliary electrode AUE_5 from being exposed to the outside. The first capping layer CCE1_5 and the second capping layer CCE2_5 may be respectively substantially the same as the first capping layer CCE1 and the second capping layer CCE2 of the display device 1 according to the embodiment of FIG. 6, and thus a detailed description thereof will be omitted for descriptive convenience.

A portion of a light emitting portion EL of an intermediate layer EML may contact (e.g., directly contact) the upper conductive layer PXE_5c of the pixel electrode PXE_5 in the first opening OP1_5 and may extend to the first capping layer CCE1_5 beyond an upper surface of the pixel defining layer PDL_5. A dummy portion EDL may be separated from the light emitting portion EL by the undercut structure of the auxiliary electrode AUE_5 and may be disposed on an upper surface of the second capping layer CCE2_5.

A portion of the common electrode CE of a common electrode layer CEL may contact (e.g., directly contact) the light emitting portion EL in the first opening OP1_5 and may extend to the first capping layer CCE1_5 beyond the upper surface of the pixel defining layer PDL_5. A dummy common electrode CDE may be separated from the common electrode CE by the undercut structure of the auxiliary electrode AUE_5 and may be disposed on the dummy portion EDL of the intermediate layer EML.

In a display device according to an embodiment, a voltage drop phenomenon of a common electrode may be reduced.

A method of manufacturing a display device according to an embodiment may provide a display device in which a voltage drop phenomenon of a common electrode is reduced.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:
1. A display device comprising:
a thin-film transistor disposed on a substrate;
an interlayer insulating layer disposed on the thin-film transistor,
a source/drain electrode and an auxiliary electrode that are formed as a same layer disposed on the interlayer insulating layer, each of the source/drain electrode and the auxiliary electrode comprising:

a first conductive layer, and a second conductive layer disposed on an upper surface of the first conductive layer, a via insulating layer disposed on the interlayer insulating layer and the source/drain electrode, the via insulating layer including a first opening exposing the auxiliary electrode;

a capping layer covering at least a portion of the auxiliary electrode; and a light emitting material layer and a common electrode layer sequentially stacked on an upper surface of the via insulating layer and an upper surface of the capping layer, wherein the source/drain electrode is electrically connected to the thin-film transistor through a contact hole penetrating the interlayer insulating layer, the auxiliary electrode has an undercut shape in which side surfaces of the first conductive layer of the auxiliary electrode are disposed inside side surfaces of the second conductive layer of the auxiliary electrode, and the capping layer comprises:

a first capping layer covering the side surfaces of the first conductive layer of the auxiliary electrode, a second capping layer separated from the first capping layer and disposed on an upper surface of the second conductive layer of the auxiliary electrode, and the capping layer comprises a conductive material.

2. The display device of claim 1, further comprising:

a pixel electrode layer disposed between the via insulating layer and each of the capping layer and the light emitting material layer, wherein the pixel electrode layer comprises:

a pixel electrode electrically connected to the source/drain electrode through a contact hole penetrating the via insulating layer;

a first dummy pixel electrode separated from the pixel electrode and disposed on the first capping layer, and a second dummy pixel electrode separated from the first dummy pixel electrode and disposed on the second capping layer.

3. The display device of claim 2, wherein the light emitting material layer comprises:

a first portion disposed on the first dummy pixel electrode; and a second portion separated from the first portion of the light emitting material layer and disposed on the second dummy pixel electrode.

4. The display device of claim 3, wherein the common electrode layer comprises:

a first portion disposed on the first portion of the light emitting material layer and directly contacting the first capping layer; and a second portion separated from the first portion of the common electrode layer and disposed on the second portion of the light emitting material layer.

5. The display device of claim 1, further comprising:

a pixel electrode disposed on the via insulating layer and electrically connected to the source/drain electrode through a contact hole penetrating the via insulating layer, wherein the capping layer and the pixel electrode are formed of a same material.

6. The display device of claim 5, wherein the light emitting material layer comprises:

a first portion disposed on the first capping layer, and a second portion separated from the first portion of the light emitting material layer and disposed on the second capping layer.

7. The display device of claim 1, wherein the auxiliary electrode further comprises a third conductive layer disposed between the first conductive layer of the auxiliary electrode and the interlayer insulating layer, and the side surfaces of the first conductive layer of the auxiliary electrode are disposed inside side surfaces of the third conductive layer of the auxiliary electrode.

8. The display device of claim 7, wherein a thickness of the first capping layer covering the side surfaces of the first conductive layer decreases as the first capping layer is closer to the second conductive layer.

9. The display device of claim 8, wherein a bottom surface of the second conductive layer of the auxiliary electrode comprises a surface exposed from the first conductive layer of the auxiliary electrode, and the first capping layer does not contact the exposed surface of the bottom surface of the second conductive layer.

10. The display device of claim 9, wherein the capping layer comprises at least any one of titanium (Ti), molybdenum (Mo), and a conductive oxide.

11. The display device of claim 10, wherein the second conductive layer and the third conductive layer comprise at least any one of titanium (Ti), molybdenum (Mo) and a conductive oxide, the first conductive layer comprises at least any one of aluminum (Al) and copper (Cu), and a thickness of the second conductive layer and a thickness of the third conductive layer are smaller than a thickness of the first conductive layer.

12. The display device of claim 8, wherein a bottom surface of the second conductive layer of the auxiliary electrode comprises a surface exposed from the first conductive layer of the auxiliary electrode, and the first capping layer contacts a portion of the exposed surface of the bottom surface of the second conductive layer of the auxiliary electrode.

13. A display device comprising:

a thin-film transistor disposed on a substrate;

an interlayer insulating layer disposed on the thin-film transistor, a source/drain electrode disposed on the interlayer insulating layer and electrically connected to the thin-film transistor through a contact hole penetrating the interlayer insulating layer, a via insulating layer disposed on the source/drain electrode;

a pixel electrode and an auxiliary electrode that are formed as a same layer disposed on the via insulating layer, each of the pixel electrode and the auxiliary electrode comprising a first conductive layer and a second conductive layer disposed on an upper surface of the first conductive layer;

a pixel defining layer disposed on the via insulating layer and the pixel electrode, the pixel defining layer having a first opening exposing the auxiliary electrode;

a capping layer covering at least a portion of the auxiliary electrode; and a light emitting material layer and a common electrode layer sequentially stacked on the pixel defining layer and the capping layer, wherein the pixel electrode is electrically connected to the source/drain electrode through a contact hole penetrating the via insulating layer, the auxiliary electrode has an undercut shape in which side surfaces of the first conductive layer of the auxiliary electrode are disposed inside side surfaces of the second conductive layer of the auxiliary electrode, the capping layer comprises:

a first capping layer covering the side surfaces of the first conductive layer of the auxiliary electrode, and a second capping layer separated from the first capping layer and disposed on an upper surface of the second conductive layer of the auxiliary electrode, and the capping layer comprises a conductive material.

14. The display device of claim 13, wherein the light emitting material layer comprises:

a first portion disposed on the first capping layer, and a second portion separated from the first portion of the light emitting material layer and disposed on the second capping layer.

15. The display device of claim 14, wherein the common electrode layer comprises:

a first portion disposed on the first portion of the light emitting material layer and directly contacting the first capping layer; and a second portion separated from the first portion of the common electrode layer and disposed on the second portion of the light emitting material layer.

16. The display device of claim 13, wherein the auxiliary electrode further comprises a third conductive layer disposed between the first conductive layer of the auxiliary electrode and the interlayer insulating layer, and the side surfaces of the first conductive layer of the auxiliary electrode are disposed inside side surfaces of the third conductive layer of the auxiliary electrode.

17. The display device of claim 16, wherein a thickness of the first capping layer covering the side surfaces of the first conductive layer decreases as the first capping layer is closer to the second conductive layer.

* * * * *